(12) United States Patent  (10) Patent No.: US 11,925,091 B2
Lee et al.  (45) Date of Patent: Mar. 5, 2024

(54) LIGHT EMITTING DISPLAY DEVICE AND MANUFACTURING METHOD THEREOF

(71) Applicant: Samsung Display Co., LTD., Yongin-si (KR)

(72) Inventors: Hyeon Bum Lee, Hwaseong-si (KR); Choong Youl Im, Yongin-si (KR); Ha Seok Jeon, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 142 days.

(21) Appl. No.: 17/147,971

(22) Filed: Jan. 13, 2021

(65) Prior Publication Data

US 2022/0020820 A1 Jan. 20, 2022

(30) Foreign Application Priority Data

Jul. 16, 2020 (KR) .................. 10-2020-0088209

(51) Int. Cl.
*H10K 59/38* (2023.01)
*G06F 3/041* (2006.01)
(Continued)

(52) U.S. Cl.
CPC ........... *H10K 59/38* (2023.02); *G06F 3/0412* (2013.01); *H10K 50/865* (2023.02);
(Continued)

(58) Field of Classification Search
CPC .............. G06F 3/0412; G06F 3/0445; G06F 2203/04103; G06F 3/04164; G06F 3/147; G06F 3/0443; G06F 3/0446; G06F 2203/04111; H01L 27/3244; H01L 27/323; H01L 27/322; H01L 51/5284; H01L 51/5253; H01L 27/3276; H01L 27/3248; H01L 27/3246; H01L 51/5012; H01L 51/5237; H01L 27/3227; H01L 51/5246;
(Continued)

(56) References Cited

U.S. PATENT DOCUMENTS 10,572,057 B2 * 2/2020 Lee .................. H01L 27/3262
11,527,519 B2 * 12/2022 Chae .................. H01L 33/62
(Continued)

FOREIGN PATENT DOCUMENTS

KR  10-2015-0061302  6/2015
KR  10-1750428  6/2017
(Continued)

*Primary Examiner* — Dismery Mercedes
(74) *Attorney, Agent, or Firm* — KILE PARK REED & HOUTTEMAN PLLC

(57) ABSTRACT

A light emitting display device includes a substrate including a display area and a non-display area adjacent to the display area, a lower pad electrode disposed on the substrate in the non-display area, a lower planarization layer disposed on the lower pad electrode and including a via hole exposing an upper surface of the lower pad electrode, an upper pad electrode disposed on the lower pad electrode, the upper pad electrode being electrically connected to the lower pad electrode through the via hole, and a covering layer in contact with a side surface portion of the upper pad electrode, the side surface portion of the upper pad electrode being disposed on the lower planarization layer.

20 Claims, 49 Drawing Sheets

(51) Int. Cl.
*H10K 50/86* (2023.01)
*H10K 59/124* (2023.01)
*H10K 59/131* (2023.01)
*H10K 59/40* (2023.01)
*H10K 71/00* (2023.01)
*G06F 3/044* (2006.01)
*H10K 59/12* (2023.01)
*H10K 59/35* (2023.01)

(52) U.S. Cl.
CPC ......... *H10K 59/124* (2023.02); *H10K 59/131* (2023.02); *H10K 59/40* (2023.02); *H10K 71/00* (2023.02); *G06F 3/0443* (2019.05); *G06F 3/0446* (2019.05); *G06F 2203/04103* (2013.01); *G06F 2203/04111* (2013.01); *H10K 59/1201* (2023.02); *H10K 59/35* (2023.02)

(58) Field of Classification Search
CPC . H01L 51/05; H01L 25/0756; H01L 25/0753; H01L 27/124; H10K 59/38; H10K 59/40; H10K 59/1201; H10K 59/131; H10K 59/124; H10K 71/00; H10K 59/12; H10K 50/865; H10K 59/35; H10K 59/122; H10K 50/805; H10K 50/84; H10K 50/824

See application file for complete search history.

(56) References Cited

U.S. PATENT DOCUMENTS

| | | | | |
|---|---|---|---|---|
| 2010/0149473 | A1* | 6/2010 | Guo | G02F 1/1345 349/122 |
| 2010/0213482 | A1* | 8/2010 | Kim | H10K 59/124 257/E33.001 |
| 2011/0090445 | A1* | 4/2011 | Kim | G02F 1/1339 349/139 |
| 2014/0027726 | A1* | 1/2014 | Choi | H10K 59/35 438/34 |
| 2014/0346448 | A1* | 11/2014 | You | H10K 59/124 438/46 |
| 2015/0108450 | A1* | 4/2015 | Son | H01L 27/1255 257/40 |
| 2017/0345882 | A1* | 11/2017 | Nam | H01L 27/3258 |
| 2018/0097047 | A1* | 4/2018 | Jung | H01L 51/5228 |
| 2018/0182814 | A1* | 6/2018 | Kim | H10K 59/38 |
| 2018/0321764 | A1* | 11/2018 | Oh | H10K 50/844 |
| 2018/0351126 | A1* | 12/2018 | Choi | H01L 51/5036 |
| 2020/0091247 | A1* | 3/2020 | Lee | G06F 3/0443 |
| 2020/0363905 | A1* | 11/2020 | Jo | G06F 3/0443 |
| 2021/0273021 | A1 | 9/2021 | Lee et al. | |
| 2021/0408136 | A1* | 12/2021 | Jeong | H10K 59/121 |

FOREIGN PATENT DOCUMENTS

| | | |
|---|---|---|
| KR | 10-2018-0074944 | 7/2018 |
| KR | 10-2018-0119718 | 11/2018 |
| KR | 10-2021-0109716 | 9/2021 |

* cited by examiner

LIGHT EMITTING DISPLAY DEVICE AND MANUFACTURING METHOD THEREOF

CROSS-REFERENCE TO RELATED APPLICATION(S)

This application claims priority to and benefits of Korean Patent Application No. 10-2020-0088209 under 35 U.S.C. § 119, filed in the Korean Intellectual Property Office on Jul. 16, 2020, the entire contents of which are incorporated herein by reference.

BACKGROUND

1. Technical Field

Embodiments of the disclosure relate to a light emitting display device and a manufacturing method thereof.

2. Description of the Related Art

A light emitting display device is a self-emissive display device that may display an image with a light emitting diode (LED) that emits light.

Unlike a liquid crystal display (LCD), a light emitting display device may not require a separate light source, and thus may have relatively reduced thickness and weight. Light emitting display devices are attracting attention as a next-generation display device for portable electronic devices because they exhibit high-quality characteristics such as low power consumption, high luminance, and high reaction speed.

The above information disclosed in this Background section is only for enhancement of understanding of the background of the invention, and therefore it may contain information that does not form the prior art that is already known in this country to a person of ordinary skill in the art.

SUMMARY

Embodiments may reduce damage of a pad electrode of a non-display area that may occur in a formation process of a color filter.

A light emitting display device according to an embodiment may include a substrate including a display area and a non-display area adjacent to the display area, a lower pad electrode disposed on the substrate in the non-display area, a lower planarization layer disposed on the lower pad electrode and including a via hole exposing an upper surface of the lower pad electrode, an upper pad electrode disposed on the lower pad electrode, the upper pad electrode being electrically connected to the lower pad electrode through the via hole, and a covering layer in contact with a side surface portion of the upper pad electrode, the side surface portion of the upper pad electrode being disposed on the lower planarization layer.

The display area may include a transistor including a source electrode and a drain electrode, the lower planarization layer being disposed on the transistor, a light emitting diode disposed on the lower planarization layer, an encapsulation layer disposed on the light emitting diode, sensing electrodes disposed on the encapsulation layer, a first color filter disposed on the sensing electrodes, a light blocking part disposed on the first color filter, a second color filter disposed on the light blocking part, a third color filter disposed on the second color filter, and an upper planarization layer disposed on the third color filter.

The lower pad electrode and the source electrode and the drain electrode may be disposed on a same layer.

The upper pad electrode and the sensing electrodes may be disposed on a same layer.

The covering layer may overlap a portion of an upper surface of the lower planarization layer, wherein the portion of the upper surface of the lower planarization layer does not overlap the upper pad electrode, and the covering layer may be in contact with a side surface of the upper pad electrode.

The covering layer may include the first color filter.

The first color filter may include one of a green color filter, a red color filter, and a blue color filter.

The covering layer may overlap a part of the upper surface of the lower planarization layer and overlap an edge and side surface of the upper pad electrode.

The covering layer may include the first color filter.

The first color filter may include one of a green color filter, a red color filter, and a blue color filter.

The upper planarization layer may overlap another portion of the upper surface of the lower planarization layer, wherein the another portion of the upper surface of the lower planarization layer may not be overlapped by the covering layer in the non-display area.

The display area may include a transistor including a source electrode and a drain electrode, the lower planarization layer being disposed on the transistor, a light emitting diode disposed on the lower planarization layer, an encapsulation layer disposed on the light emitting diode, sensing electrodes disposed on the encapsulation layer, a light blocking part disposed on sensing electrodes, a first color filter disposed on the light blocking part, a second color filter disposed on the first color filter, a third color filter disposed on the second color filter, and an upper planarization layer disposed on the third color filter.

The light blocking part may include an organic material including a black color pigment without a conductive material, and the covering layer may include the light blocking part.

The covering layer may overlap a portion of an upper surface of the lower planarization layer, wherein the portion of the upper surface of the lower planarization layer does not overlap the upper pad electrode, and the covering layer may be in contact with a side surface of the upper pad electrode.

The covering layer may overlap a part of the upper surface of the lower planarization layer and overlap an edge and side surfaces of the upper pad electrode.

The upper planarization layer may overlap overlaps another portion of the upper surface of the lower planarization layer, wherein the another portion of the upper surface of the lower planarization layer may not be overlapped by the covering layer in the non-display area.

At least one of the upper pad electrode and the lower pad electrode may include an upper layer including titanium (Ti), a middle layer including aluminum (Al), and a lower layer including titanium (Ti).

The light emitting display device may further include a buffer layer disposed between the lower planarization layer and the upper pad electrode.

A manufacturing method of a light emitting display device according to an embodiment may include in a display area of a substrate, forming a transistor including a source electrode and a drain electrode, forming a lower planarization layer on the transistor, forming a light emitting diode on the lower planarization layer, forming an encapsulation layer on the light emitting diode, forming sensing electrodes on the encapsulation layer, forming a first color filter on the sensing electrodes, forming a light blocking part on the first color filter, forming a second color filter on the light blocking part, forming a third color filter on the second color filter, and forming an upper planarization layer on the third color filter. The method may include in a non-display area of the substrate, forming a lower pad electrode disposed on a same layer as the source electrode and the drain electrode, forming an upper pad electrode disposed on a same layer as the sensing electrodes, the upper pad electrode being disposed on the lower pad electrode, and forming a covering layer in contact with a side surface part of the upper pad electrode, the side surface part of the upper pad electrode being disposed on the lower planarization layer, wherein the covering layer includes the first color filter.

A manufacturing method of a light emitting display device according to another embodiment may include in a display area of a substrate, forming a transistor including a source electrode and a drain electrode, forming a lower planarization layer on the transistor, forming a light emitting diode on the lower planarization layer, forming an encapsulation layer on the light emitting diode, forming sensing electrodes on the encapsulation layer, forming a light blocking part on the sensing electrodes, forming a first color filter on the light blocking part, forming a second color filter on the first color filter, forming a third color filter on the second color filter, and forming an upper planarization layer on the third color filter. The method may include in a non-display area of the substrate, forming a lower pad electrode disposed on a same layer as the source electrode and the drain electrode, forming an upper pad electrode disposed on a same layer as the sensing electrodes, the upper pad electrode being disposed on the lower pad electrode, and forming a covering layer in contact with a side surface part of the upper pad electrode, the side surface part of the upper pad electrode being disposed on the lower planarization layer, wherein the covering layer includes the light blocking part.

According to an embodiment, it may be possible to reduce damage to the pad electrode that may occur during the color filter forming process.

Since the metal layer of the pad electrode may be protected, the performance of the pad electrode may also be maintained.

DETAILED DESCRIPTION OF THE EMBODIMENTS

Figure 1:
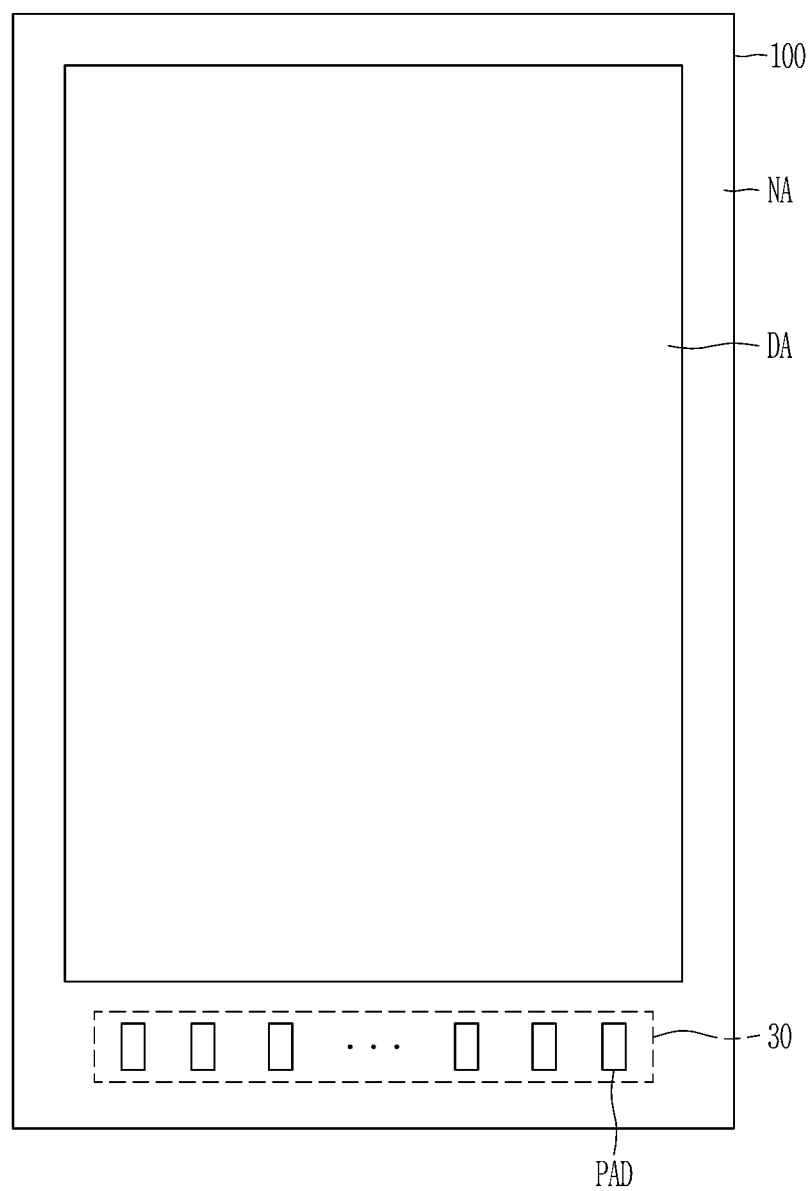
FIG. 1 is a schematic top plan view of a light emitting display device according to an embodiment.

Embodiments of the invention will be described more fully hereinafter with reference to the accompanying drawings, in which embodiments of the invention are shown. As those skilled in the art would realize, the described embodiments may be modified in various different ways, all without departing from the spirit or scope of the invention.

Descriptions of parts not related to the invention may be omitted, and like reference numerals designate like elements throughout the specification.

Further, since sizes and thicknesses of elements shown in the accompanying drawings may be arbitrarily given for better understanding and ease of description, the invention is not limited to the illustrated sizes and thicknesses.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

It will be understood that when an element such as a layer, film, area, or substrate is referred to as being "on" another element, the element can be directly on another element or intervening elements may also be present. In contrast, when an element is referred to as being "directly on" another element, there may be no intervening elements present. Further, in the specification, the word "on" or "above" means positioned on or below the object portion, and does not necessarily mean positioned on the upper side of the object portion based on a gravitational direction.

Unless explicitly described to the contrary, words such as "comprise", "have" and "include", will be understood to imply the inclusion of stated elements but not the exclusion of any other elements.

The phrase "in a plan view" means viewing a target portion from the top, and the phrase "in a cross-sectional view" means viewing a cross-section formed by vertically cutting a target portion from the side.

The phrase "connected to" does not only mean that two or more constituent elements may be directly connected to each other, but also that two or more constituent elements may be indirectly connected, physically connected, and electrically connected through other constituent elements. Parts that may be substantially integral may be connected to each other although referred to as different names depending on the position or function.

The term "overlap" may include layer, stack, face or facing, extending over, extending under, covering or partly covering or any other suitable term as would be appreciated and understood by those of ordinary skill in the art. The expression "not overlap" may include apart from or set aside from or offset from and any other suitable equivalents as would be appreciated and understood by those of ordinary skill in the art.

As used herein, the singular forms, "a", "an" and "the" are intended to include the plural forms as well, unless the context clearly indicates otherwise. The phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic top plan view of a light emitting display device according to an embodiment.

Referring to FIG. 1, a light emitting display device according to an embodiment may include a substrate 100 and a pad part 30.

The substrate 100 may include a display area DA and a non-display area NA. The display area DA may be an area in which pixels including light emitting diodes and transistors may be formed to display an image, and the non-display area NA may be an area in which an image may not be displayed. The non-display area NA may surround the display area DA. The non-display area NA may be an area including the pad part 30 in which pads PAD for applying a driving signal to the pixel may be formed.

Pixels (not shown) including a transistor and a light emitting diode (LED) may be formed in the display area DA. A sensing area TA (FIG. 2) including sensing electrodes (520 and 540 in FIG. 2) may be further formed on the upper portion of the display area DA to recognize a touch.

In the non-display area NA, a driving voltage line (not shown), a driving low voltage line (not shown), and the pad part 30 may be formed to transmit driving signals such as voltages to the pixels formed in the display area DA. Sensing wires (512 and 522 in FIG. 2) may be formed in the non-display area NA. The sensing wires 512 and 522 may be electrically connected to sensing electrodes 520 and 540. The sensing wires 512 and 522 and sensing electrodes 520 and 540 are described with reference to FIG. 2.

The pad part 30 may be disposed on a portion of the non-display area NA and include the pads PAD. Voltages, signals, etc. may be applied to the voltage lines (not shown) and the sensing wires (512 and 522 of FIG. 2) electrically connected to the display area DA through pads PAD. A flexible printed circuit board (FPCB) may be attached to the non-display area NA. The flexible printed circuit board (FPCB) may be electrically connected to the pad part 30. The flexible printed circuit board (FPCB) and the pad part 30 may be electrically connected by an anisotropic conductive film. The flexible printed circuit board (FPCB) may include a driving integrated circuit (not shown), and a driving signal output from the driving integrated circuit may be supplied to each pixel through the pads PAD of the pad part 30.

Figure 2:
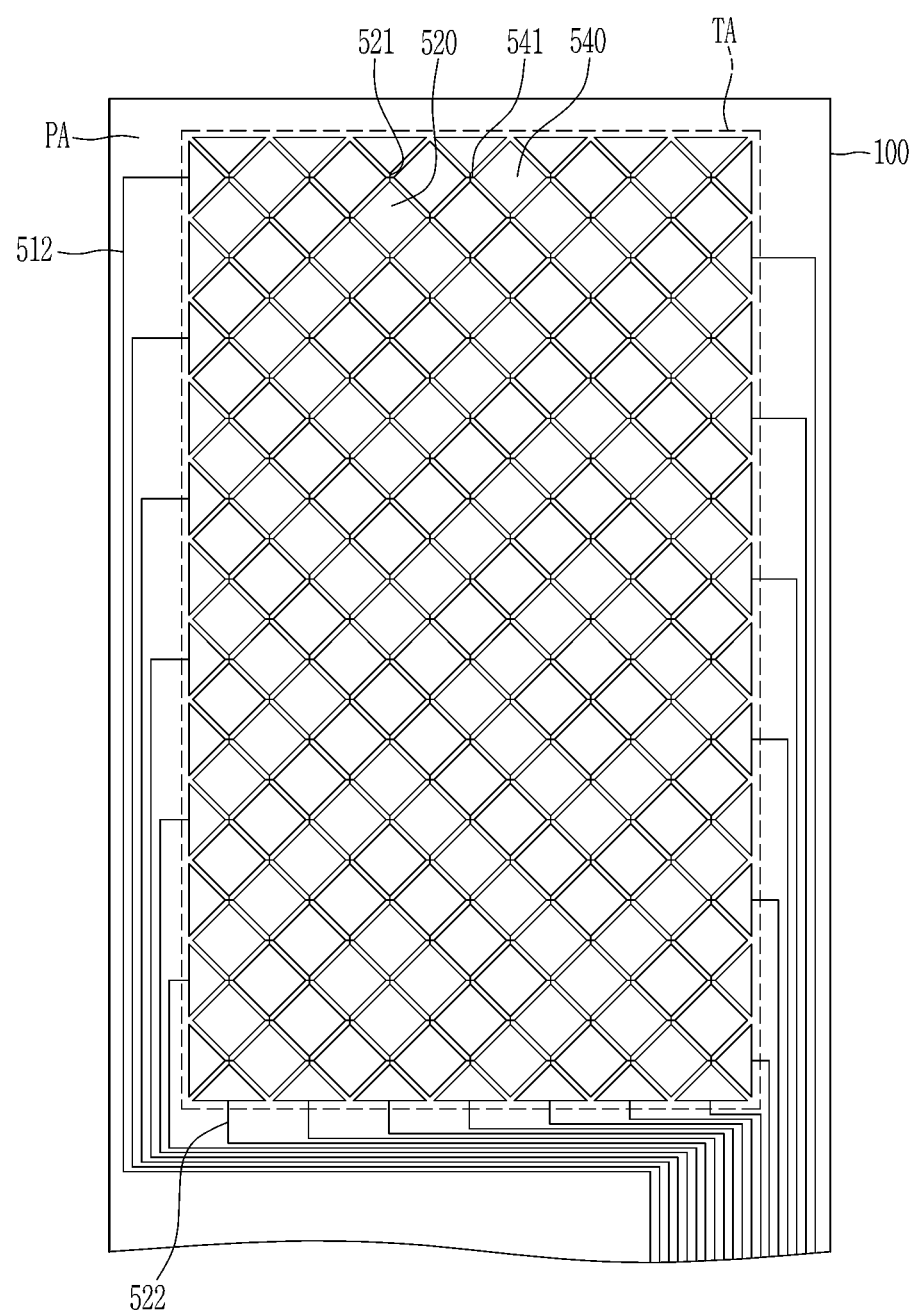
FIG. 2 is a schematic top plan view of a part including a sensing part in a light emitting display device according to an embodiment.

FIG. 2 is a schematic top plan view of a part including a sensing part in a light emitting display device according to an embodiment.

Referring to FIG. 2, the substrate 100 may further include a sensing area TA in which sensing electrodes 520 and 540 may be formed on the display area DA, and a peripheral area PA surrounding the sensing area TA. According to an embodiment, the sensing area TA may include the display area DA of FIG. 1 or a part of the non-display area NA, and the peripheral area PA may include an area except for the sensing area in the non-display area NA of FIG. 1.

The sensing area TA may include sensing electrodes 520 and 540. The sensing electrodes 520 and 540 may include first sensing electrodes 520 and second sensing electrodes 540.

The first sensing electrode 520 and the second sensing electrode 540 may be electrically separated from each other. According to an embodiment, the first sensing electrode 520 may be a sensing input electrode, and the second sensing electrode 540 may be a sensing output electrode. The first sensing electrode 520 may be a sensing output electrode, and the second sensing electrode 540 may be a sensing input electrode.

First sensing electrodes 520 and second sensing electrodes 540 may be alternately distributed so as to not overlap each other in the sensing area TA and be disposed in a mesh form. First sensing electrodes 520 may be respectively disposed in plural along a column direction and a row direction, and second sensing electrodes 540 may be respectively disposed in plural in the column direction and row direction. The first sensing electrodes 520 may be electrically connected to each other in the column direction by first sensing electrode connections 521, and the second sensing electrodes 540 may be electrically connected to each other in the row direction by second sensing electrode connections 541.

The first sensing electrode 520 and the second sensing electrode 540 may be disposed on a same layer. According to an exemplary embodiment, the first sensing electrode 520 and the second sensing electrode 540 may be disposed on different layers. The first sensing electrode 520 and the second sensing electrode 540 may have a rhombus shape, but are not limited thereto. The first sensing electrode 520 and the second sensing electrode 540 may have a polygonal shape such as a quadrangle or hexagonal, or a circular shape or an elliptical shape, and may be implemented in various shapes such as having a protrusion to improve the sensitivity of the sensing sensor. The first sensing electrode 520 and the second sensing electrode 540 may be formed of a transparent conductor or an opaque conductor, and each of the sensing electrodes 520 and 540 may have openings. The opening formed in the sensing electrodes 520 and 540 may serve to allow the light emitted from the light emitting diode (LED) to be emitted to the front without interference.

The first sensing electrodes 520 may be electrically connected to each other by the first sensing electrode connections 521 (also referred to as a bridge), and the second sensing electrode 540 may be electrically connected to each other by the second sensing electrode connections 541 (also referred to as a bridge). In case that first sensing electrodes 520 may be connected in a first direction, second sensing electrodes 540 may be connected in a second direction intersecting the first direction. In case that the first sensing electrode 520 and the second sensing electrode 540 may be disposed on a same layer, one of the first sensing electrode connection 521 and the second sensing electrode connection 541 may be disposed on a same layer as the first sensing electrode 520 and the second sensing electrode 540, and another may be disposed on a different layer from the first sensing electrode 520 and the second sensing electrode 540. As a result, first sensing electrodes 520 and second sensing electrodes 540 may be electrically separated. The sensing electrode connection disposed on a different layer may be disposed on the upper or lower layer of the first sensing electrode 520 and the second sensing electrode 540, and in an exemplary embodiment described below, the description is focused on an embodiment in which the sensing electrode connection may be disposed in the lower layer, for example, a layer closer to the substrate 100.

In the peripheral area PA, sensing wires 512 and 522 respectively electrically connected to the first sensing electrodes 520 and the second sensing electrodes 540 may be disposed. The first sensing wire 512 may be electrically connected to second sensing electrodes 540 disposed in a row direction, and the second sensing wire 522 may be electrically connected to first sensing electrodes 520 disposed in a column direction. According to an embodiment, the first sensing wire 512 and the second sensing wire 522 may also be electrically connected to a part among the pads PAD included in the pad part 30 of FIG. 1.

In FIG. 2, a sensing part of a mutual-cap method for sensing a touch using two sensing electrodes 520 and 540 is shown. However, according to an embodiment, the sensing part of a self-cap method through which the touch may be sensed using only one sensing electrode may be formed.

Hereinafter, a configuration of the light emitting display device is described with reference to FIG. 3 based on a cross-sectional view in the display area DA.

Figure 3:
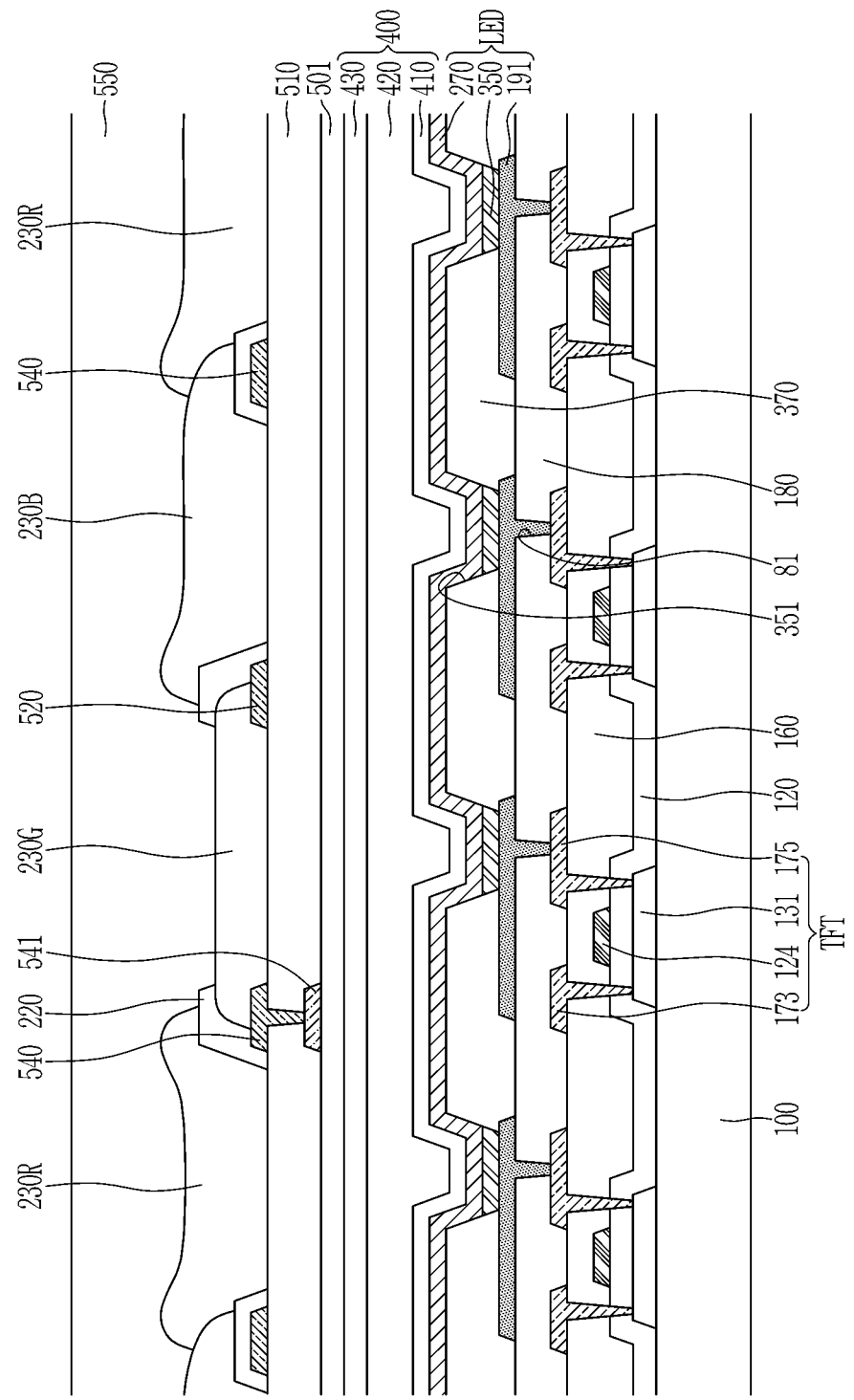
FIG. 3 is a schematic cross-sectional view showing a part of a display area in a light emitting display device according to an embodiment.

FIG. 3 is a schematic cross-sectional view showing a part of a display area in a light emitting display device according to an embodiment.

Referring to FIG. 3, the display area DA among the light emitting display device according to an embodiment may include a substrate 100, a transistor TFT, a gate insulating layer 120, an interlayer insulating layer 160, a lower planarization layer 180, a pixel electrode 191, an emission layer 350, a partition 370, a common electrode 270, and an encapsulation layer 400. The transistor TFT may include a semiconductor layer 131, a gate electrode 124, a source electrode 173, and a drain electrode 175. Here, the pixel electrode 191, the emission layer 350, and the common electrode 270 may constitute a light emitting diode (LED). The light emitting display device may further include the sensing area TA disposed on the display area DA, and the sensing area TA may include a sensing insulating layer 510, sensing electrodes 520 and 540, and a sensing electrode connection 541. The light emitting display device may further include a light blocking part 220, a color filter layer, and an upper planarization layer 550 above the sensing area TA. The color filter layer may include a red color filter 230R, a green color filter 230G, and a blue color filter 230B.

The substrate 100 may include a material that may not bend because of a rigid characteristic such as glass, or may include a flexible material that may be flexible such as plastic or polyimide. Although not shown in FIG. 3, a lower buffer layer (not shown) or a barrier layer (not shown) for flattening the surface of the substrate 100 and blocking penetration of impurity elements may be disposed on the substrate 100.

The semiconductor layer 131 may be disposed on the substrate 100. The semiconductor layer 131 may be formed of an oxide semiconductor, amorphous silicon, polycrystalline silicon, or the like, or a combination thereof, and may include a channel area, a source area, and a drain area divided according to impurity doping. The source area and drain area may have a conductive characteristic corresponding to a conductor.

The gate insulating layer 120 may cover the semiconductor layer 131 and the substrate 100. The gate insulating layer 120 may be an inorganic insulating layer including a silicon oxide ($SiO_x$), a silicon nitride ($SiN_x$), a silicon oxynitride ($SiON_x$), or the like, or a combination thereof.

The gate electrode 124 may be disposed on the gate insulating layer 120. The gate electrode 124 may include a metal or a metal alloy such as copper (Cu), molybdenum (Mo), aluminum (Al), silver (Ag), chromium (Cr), tantalum (Ta), titanium (Ti), or a combination thereof. The gate electrode 124 may be composed of a single layer or multiple layers. An area of the semiconductor layer 131 overlapping the gate electrode 124 in a plane may be a channel area.

The interlayer insulating layer 160 may cover the gate electrode 124 and the gate insulating layer 120. The interlayer insulating layer 160 may include an inorganic insulating layer including a silicon oxide ($SiO_x$), a silicon nitride ($SiN_x$), a silicon oxynitride ($SiON_x$), or the like, or a combination thereof.

The source electrode 173 and the drain electrode 175 may be disposed on the interlayer insulating layer 160. The source electrode 173 and the drain electrode 175 may be electrically connected to the source area and the drain area of the semiconductor layer 131 by openings formed in the interlayer insulating layer 160 and the gate insulating layer 120, respectively. Accordingly, the aforementioned semiconductor layer 131, gate electrode 124, source electrode 173, and drain electrode 175 may constitute one transistor TFT. According to an embodiment, the transistor TFT may include only the source area and the drain area of the semiconductor layer 131 instead of the source electrode 173 and the drain electrode 175.

The source electrode 173 and the drain electrode 175 may include a metal or a metal alloy such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a combination thereof. The source electrode 173 and the drain electrode 175 may be composed of a single layer or multiple layers. The source electrode 173 and the drain electrode 175 according to an embodiment may be composed of a triple layer including an upper layer, a middle layer, and a lower layer, and the upper layer and the lower layer may include titanium (Ti) and the middle layer may include aluminum (Al).

The lower planarization layer 180 may be disposed on the source electrode 173 and the drain electrode 175. The lower planarization layer 180 may cover the source electrode 173, the drain electrode 175, and the interlayer insulating layer 160. The lower planarization layer 180 may be for planarizing the surface of the substrate 100 equipped with the transistor TFT, and it may be an organic insulator and include at least one material selected from a group consisting of polyimide, polyamide, acryl resin, benzocyclobutene, and phenol resin.

The pixel electrode 191 may be disposed on the lower planarization layer 180. The pixel electrode 191 may be also referred to as an anode, and may be composed of a single layer including a transparent conductive oxide film and a metal material or multiple layers including them. The transparent conductive oxide film may include ITO (Indium Tin Oxide), poly-ITO, IZO (Indium Zinc Oxide), IGZO (Indium Gallium Zinc Oxide), ITZO (Indium Tin Zinc Oxide), or a combination thereof. The metal material may include silver (Ag), molybdenum (Mo), copper (Cu), gold (Au), aluminum (Al), or a combination thereof.

The lower planarization layer 180 may include a via hole 81 (also called an opening) that exposes the drain electrode 175. The drain electrode 175 and the pixel electrode 191 may be physically and electrically connected through the via hole 81 of the lower planarization layer 180. Accordingly, the pixel electrode 191 may receive an output current to be transmitted from the drain electrode 175 to the emission layer 350.

The partition 370 may be disposed on the pixel electrode 191 and the lower planarization layer 180. The partition 370 may also be referred to as a pixel defining layer PDL and include a pixel opening 351 through which a portion of the upper surface of the pixel electrode 191 may be exposed. The partition 370 may partition a formation position of the emission layer 350 so that the emission layer 350 may be disposed on a portion exposed on the upper surface of the pixel electrode 191. The partition 370 may be an organic insulator including at least one material selected from a group consisting of polyimide, polyamide, acryl resin, benzocyclobutene, and phenol resin. According to an embodiment, the partition 370 may be formed of a black pixel definition layer (PDL) including a black color pigment.

The emission layer 350 may be disposed within the pixel opening 351 partitioned by the partition 370. The emission layer 350 may include an organic material that emits red, green, and blue light. The emission layer 350 that emits light of red, green, and blue may include a low molecular weight or a high molecular weight organic material. The emission layer 350 is shown as a single layer in FIG. 3, but in practice an auxiliary layer such as an electron injection layer, an electron transport layer, a hole transport layer, and a hole injection layer may also be included above and below the emission layer 350, the hole injection layer and the hole transport layer may be disposed under the emission layer 350, and the electron transport layer and the electron injection layer may be disposed above the emission layer 350.

The common electrode 270 may be disposed on the partition 370 and the emission layer 350. The common electrode 270 may also be referred to as a cathode, and may be formed of a transparent conductive layer including ITO (Indium Tin Oxide), IZO (Indium Zinc Oxide), IGZO (Indium Gallium Zinc Oxide), ITZO (Indium Tin Zinc Oxide), or a combination thereof. The common electrode 270 may have a translucent characteristic, and a micro-cavity may be formed together with the pixel electrode 191. According to the micro-cavity structure, light with a specific wavelength may be emitted upwards by a gap and characteristics between both electrodes, and as a result red, green, or blue may be displayed.

The encapsulation layer 400 may be disposed on the common electrode 270. The encapsulation layer 400 may include at least one inorganic layer and at least one organic layer, and in an embodiment, the encapsulation layer 400 may include a first inorganic encapsulation layer 410, an organic encapsulation layer 420, and a second inorganic encapsulation layer 430. The first inorganic encapsulation layer 410, the organic encapsulation layer 420, and the second inorganic encapsulation layer 430 may be disposed in the display area DA and part of the non-display area NA. According to an embodiment, the organic encapsulation layer 420 may be formed around the display area DA, and the first inorganic encapsulation layer 410 and the second inorganic encapsulation layer 430 may be formed up to the non-display area NA. The encapsulation layer 400 may be to protect the light emitting diode (LED) from moisture or oxygen that may flow inward from the outside, and one end of each of the first inorganic encapsulation layer 410 and the second inorganic encapsulation layer 430 may be formed to be in direct contact. Further, according to an embodiment, the encapsulation layer 400 may include a structure in which an inorganic layer and an organic layer may be sequentially further stacked.

A buffer layer 501 may be disposed on the encapsulation layer 400. The buffer layer 501 may be formed of the inorganic insulating layer, and the inorganic material included in the inorganic insulating layer may be at least any one among silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. According to an embodiment, the buffer layer 501 may be omitted.

The sensing electrode connection 541, the sensing insulating layer 510, and sensing electrodes 520 and 540 may be disposed on the buffer layer 501. One of the first sensing electrode connection 521 and the second sensing electrode connection 541 may be disposed on a same layer as the sensing electrodes 520 and 540, and another may be disposed on a different layer from the sensing electrodes 520 and 540. Hereinafter, a description is given in which the second sensing electrode connection 541 may be disposed on a different layer from the sensing electrodes 520 and 540 as an example.

The sensing electrode connection 541, the sensing insulating layer 510, and the sensing electrodes 520 and 540 may constitute the sensor. Sensors may be classified as a resistive type, a capacitive type, an electromagnetic type, an optical type, and the like. The sensor according to an embodiment may be a capacitive type of sensor.

The sensing electrode connection 541 may be formed on the buffer layer 501, and the sensing insulating layer 510 may be disposed on the buffer layer 501 and the second sensing electrode connection 541. The sensing insulating layer 510 may be an inorganic insulating layer, and may include an organic material according to an embodiment. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one of acryl-based resins, methacrylic resins, polyisoprene, vinyl resins, epoxy resins, urethane-based resins, cellulosic resins, and perylene resins.

Sensing electrodes 520 and 540 may be disposed on the sensing insulating layer 510, and the first sensing electrode 520 and the second sensing electrode 540 may be electrically insulated. The sensing insulating layer 510 may include an opening that exposes the upper surface of the second sensing electrode connection 541, and the second sensing electrode connection 541 may be electrically connected to the second sensing electrode 540 through the opening of the sensing insulating layer 510 to electrically connect two second sensing electrodes 540. The first sensing electrode connection 521 connecting the first sensing electrode 520 may be formed on a same layer as the first sensing electrode 520 and the second sensing electrode 540.

Sensing electrodes 520 and 540 may include a conductive material having good conductivity. For example, sensing electrodes 520 and 540 may include a metal or a metal alloy such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or a combination thereof. Sensing electrodes 520 and 540 may be configured as a single layer or multiple layers. The sensing electrodes 520 and 540 may include openings so that light emitted from the light emitting diode (LED) may be emitted upward without interference. According to an embodiment, sensing electrodes 520 and 540 may be composed of a triple layer including an upper layer, a middle layer, and a lower layer, and the upper layer and the lower layer may include titanium (Ti), while the middle layer may include aluminum (Al).

A green color filter 230G may be disposed on the sensing electrodes 520 and 540. The green color filter 230G may overlap the emission layer 350 of the light emitting diode corresponding to the green pixel. The emission layer 350 overlapped with the green color filter 230G may emit green light. The edge of the green color filter 230G may cover at least part of the upper surface of sensing electrodes 520 and 540. The green color filter 230G may prevent damage that the pad PAD may suffer in the color filter process. This is described in detail below with respect to FIG. 4.

The light blocking part 220 may be disposed on the green color filter 230G. The light blocking part 220 may be disposed so as to overlap the sensing electrodes 520 and 540 and not overlap emission layer 350. The light blocking part 220 may include an organic material including a black color pigment, or a mixture of an organic material and an inorganic material including a black color pigment. As the sensing electrodes 520 and 540 and the light blocking part 220 may be disposed so as to not overlap the emission layer 350, the emission layer 350 capable of displaying the image may not be obstructed by the sensing electrodes 520 and 540 and the light blocking part 220.

A blue color filter 230B and a red color filter 230R may be sequentially disposed on the light blocking part 220. The blue color filter 230B may overlap the emission layer 350 of the light emitting diode corresponding to the blue pixel. The emission layer 350 overlapped with the blue color filter 230B may emit blue light. The red color filter 230R may overlap the emission layer 350 of the light emitting diode corresponding to the red pixel. The emission layer 350 overlapped with the red color filter 230R may emit red light.

According to an embodiment, a color filter layer including the red color filter 230R, the green color filter 230G, and the blue color filter 230B may be replaced with a color conversion layer or may further include a color conversion layer. The color conversion layer may include a quantum dot.

The upper planarization layer 550 may be disposed above the color filter layer and the light blocking part 220. The upper planarization layer 550 may be for flattening the upper surface of the light emitting display device and may be an organic insulator. The organic insulator may include at least one material selected from a group of polyimide, polyamide, acryl resin, benzocyclobutene, and phenol resin.

Hereinafter, the pad part 30 of the light emitting display device is described based on the cross-sectional view in the non-display area NA of the light emitting display device with reference to FIGS. 4 to 6.

Figure 4:
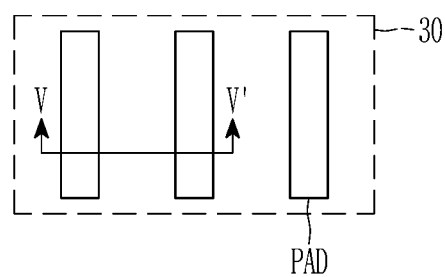
FIG. 4 is a schematic top plan view of a part of a pad part of a light emitting display device.

FIG. 4 is a schematic top plan view of a part of a pad part of a light emitting display device. FIG. 5 is a schematic cross-sectional view of a pad part of a light emitting display device according to an embodiment of FIG. 3 taken along line V-V' of FIG. 4. FIG. 6 is a view schematically illustrating portion A in FIG. 5 in detail.

Figure 5:
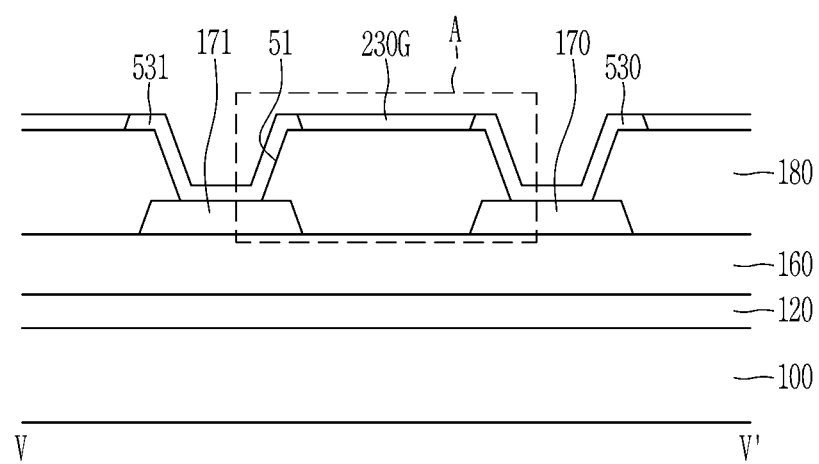
FIG. 5 is a schematic cross-sectional view of a pad part of a light emitting display device according to an embodiment of FIG. 3 taken along line V-V' of FIG. 4.
Figure 6:
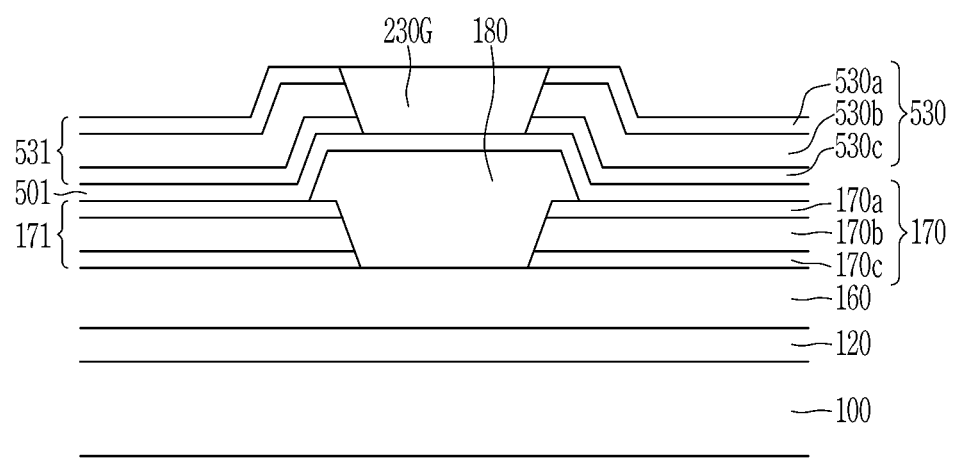
FIG. 6 is a view schematically illustrating in detail portion A in FIG. 5.

The pad part 30 shown in FIG. 4 may correspond to the pad part 30 of FIG. 1, and the stacking order of the light emitting display device shown in FIG. 5 and FIG. 6 may be the same as in the light emitting display device of FIG. 3.

Referring to FIG. 4 to FIG. 6, the pad PAD of the pad part 30 may include lower pad electrodes 170 and 171 and upper pad electrodes 530 and 531.

The lower pad electrodes 170 and 171 may be disposed on the interlayer insulating layer 160. The lower pad electrodes 170 and 171 may include a first lower pad electrode 170 and a second lower pad electrode 171 separated from each other. The lower pad electrodes 170 and 171 may be disposed on a same layer as the source electrode 173 and the drain electrode 175 of FIG. 3. The lower pad electrodes 170 and 171, the source electrode 173, and the drain electrode 175 of FIG. 3 may be formed of a same material. The lower pad electrodes 170 and 171 may include the metal or the metal alloy thereof such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or a combination thereof. The lower pad electrodes 170 and 171 may be composed of a single layer or multiple layers.

In an embodiment, the lower pad electrodes 170 and 171 may be configured of a triple layer. In an embodiment, one end of each of the lower pad electrodes 170 and 171 may have a tapered shape, and according to an embodiment, one end of each of the lower pad electrodes 170 and 171 may have a vertical surface that may be perpendicular to the substrate 100.

FIG. 6 illustrates the lower pad electrodes 170 and 171 formed as a triple layer including an upper layer 170a, an intermediate layer 170b, and a lower layer 170c. The upper layer 170a and the lower layer 170c of the lower pad electrodes 170 and 171 may include titanium (Ti), and the intermediate layer 170b may include aluminum (Al).

A lower planarization layer 180 may be disposed on the lower pad electrodes 170 and 171. The lower planarization layer 180 may be disposed between the first lower pad electrode 170 and the second lower pad electrode 171 that may be separated from each other.

The upper pad electrodes 530 and 531 may be disposed on the lower pad electrodes 170 and 171. The upper pad electrodes 530 and 531 may overlap at least part of the lower planarization layer 180. The upper pad electrodes 530 and 531 may include a first upper pad electrode 530 and a second upper pad electrode 531 separated from each other.

The upper pad electrodes 530 and 531 and the sensing electrodes 520 and 540 of FIG. 3 may be at a same layer. The upper pad electrodes 530 and 531 and the sensing electrodes 520 and 540 may be formed of a same material. The upper pad electrodes 530 and 531 may include the metal or the metal alloy thereof such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or a combination thereof. The upper pad electrodes 530 and 531 may be composed of a single layer or multiple layers.

The lower planarization layer 180 may include a via hole 51 exposing the upper surface of the lower pad electrodes 170 and 171. The upper pad electrodes 530 and 531 and the lower pad electrodes 170 and 171 may be in contact with each other by the via hole 51 of the lower planarization layer 180 to be physically and electrically connected. The upper surface of the lower planarization layer 180 excluding the portion overlapping the upper pad electrodes 530 and 531 may be exposed to the outside.

As shown in FIG. 6, a buffer layer 501 may be disposed on the lower pad electrodes 170 and 171 and the lower planarization layer 180. The upper pad electrodes 530 and 531 may be disposed on the buffer layer 501. In FIG. 6, since the buffer layer 501 may be disposed between the lower pad electrodes 170 and 171 and the upper pad electrodes 530 and 531, it is shown that they may not be electrically connected to each other, but in the part not shown in FIG. 6, an opening may be formed in the buffer layer 501, so that the lower pad electrodes 170 and 171 and the upper pad electrodes 530 and 531 may be electrically connected.

This is because the lower pad electrodes 170 and 171 and the upper pad electrodes 530 and 531 may be electrically connected to each other to form the pad. According to an embodiment, the buffer layer 501 may be omitted.

FIG. 6 shows the upper pad electrodes 530 and 531 configured of the triple layer including an upper layer 530a, a middle layer 530b, and a lower layer 530c. The upper layer 530a and the lower layer 530c of the upper pad electrodes 530 and 531 may include titanium (Ti), and the middle layer 530b may include aluminum (Al).

A green color filter 230G may be disposed between the adjacent upper pad electrodes 530 and 531. The green color filter 230G may cover the upper surface of the lower planarization layer 180 (or the upper surface of the buffer layer 501), which may not overlap the upper pad electrodes 530 and 531 and may be exposed. The green color filter 230G may be in contact with the side surface part disposed on the lower planarization layer 180 among the side surface of the upper pad electrodes 530 and 531, thereby serving as a covering layer to prevent the middle layer 530b of the upper pad electrodes 530 and 531 from being exposed to the outside. For example, the green color filter 230G may be in contact with each side surface of the upper layer 530a, the middle layer 530b, and the lower layer 530c of the upper pad electrodes 530 and 531. Accordingly, the middle layer 530b including aluminum (Al) may be prevented from receiving damage that may occur in the subsequent processes.

For example, in case that the side surface of the upper pad electrode 530 is exposed, in the process for forming the light blocking part 220, the blue color filter 230B, and the red color filter 230R after the formation process of the green color filter 230G, the metal of the middle layer 530b of the upper pad electrode 530 may be eroded and the performance of the pad electrode may be deteriorated. However, according to an embodiment of the invention, the green color filter 230G may be formed to cover the side surface of the upper pad electrodes 530 and 531 so as to not expose the middle layer 530b of the upper pad electrodes 530 and 531, the middle layer 530b including aluminum (Al) may be prevented from receiving damage that may occur in subsequent processes.

The green color filter 230G of FIG. 5 and FIG. 6 may be formed together in case of forming the green color filter 230G of FIG. 3. The green color filter 230G of FIG. 5 and FIG. 6 and the green color filter 230G of FIG. 3 may be formed of a same material.

Hereinafter, a manufacturing method of the light emitting display device including the display area of FIG. 3 and the pad part 30 of FIG. 5 and FIG. 6 may be described with reference to FIG. 7A to FIG. 11B. In order to simplify the drawings and clearly explain the characteristics of the embodiment, the structure under the organic encapsulation layer 420 may be omitted in the display area DA.

FIG. 7A to FIG. 11B are views schematically showing a manufacturing method of a light emitting display device according to an embodiment. FIG. 7A, FIG. 8A, FIG. 9A, FIG. 10A, and FIG. 11A correspond to the display area DA of the light emitting display device described in FIG. 3, and FIG. 7B, FIG. 8B, FIG. 9B, FIG. 10B, and FIG. 11B correspond to the non-display area NA of the light emitting display device described in FIG. 6.

Figure 7A:
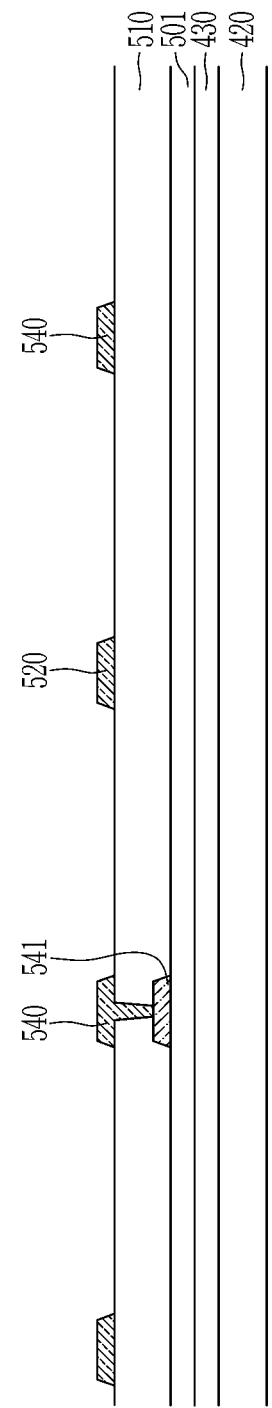
FIG. 7A to FIG. 11B are views schematically showing a manufacturing method of a light emitting display device according to an embodiment.
Figure 7B:
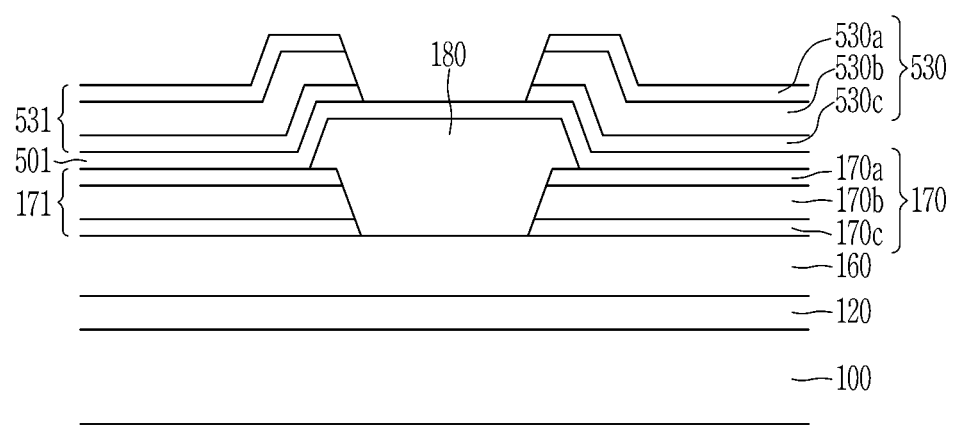

Referring to FIGS. 7A and 7B, after a light emitting diode LED may be formed on a substrate 100 in a display area DA, an encapsulation layer 400 may be formed. Hereinafter, an organic encapsulation layer 420 and a second inorganic encapsulation layer 430 included in the encapsulation layer 400 are shown. On the encapsulation layer 400, a buffer layer 501, a second sensing electrode connection 541, a sensing insulating layer 510, and sensing electrodes 520 and 540 may be sequentially stacked.

In the non-display area NA, a gate insulating layer 120 and an interlayer insulating layer 160 may be sequentially stacked on the substrate 100. Lower pad electrodes 170 and 171 may be formed in the non-display area NA. Lower pad electrodes 170 and 171 and the source electrode 173 and the drain electrode 175 of the display area DA may be formed by a same material and a same method on a same layer. For example, in case that the source electrode 173 and the drain electrode 175 are formed on the interlayer insulating layer 160 in the display area DA, the lower pad electrodes 170 and 171 may be formed on the interlayer insulating layer 160 in the non-display area NA. In case that the lower planarization layer 180 is formed on the source electrode 173 and the drain electrode 175 in the display area DA, the lower planarization layer 180 may be formed on the lower pad electrodes 170 and 171 in the non-display area NA. Further, in case that the buffer layer 501 is formed in the display area DA, the buffer layer 501 may be formed in the non-display area NA.

Upper pad electrodes 530 and 531 may be formed in the non-display area NA. Upper pad electrodes 530 and 531 and the sensing electrodes 520 and 540 of the display area DA may be formed with a same material and a same method on a same layer. For example, in case that the sensing electrodes 520 and 540 may be formed on the sensing insulating layer 510 in the display area DA, the upper pad electrodes 530 and 531 may be formed on the lower planarization layer 180 in the non-display area NA.

In the non-display area NA, the lower planarization layer 180 disposed between the upper pad electrodes 530 and 531 and the lower pad electrodes 170 and 171 may be the same as the lower planarization layer 180 of the display area DA, and the lower planarization layer 180 may be entirely formed over the display area DA and the non-display area NA.

Figure 8A:
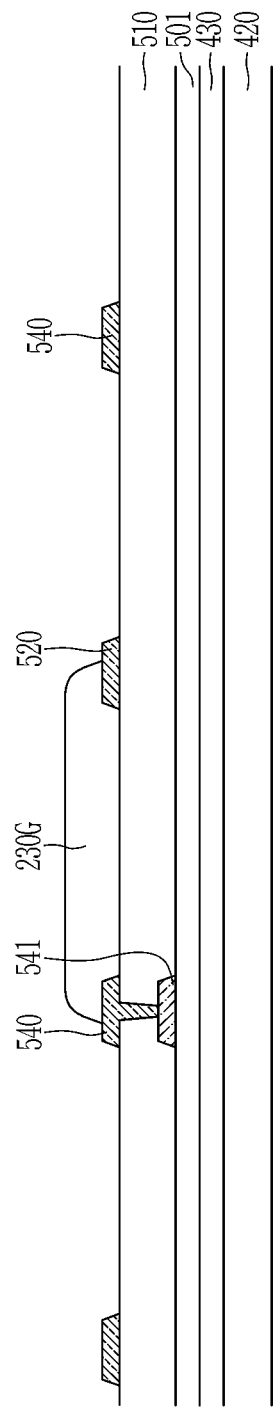
Figure 8B:
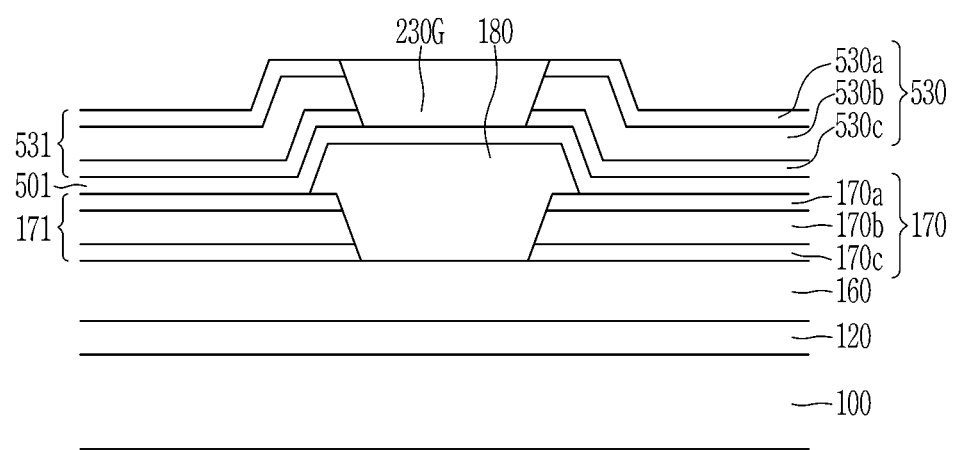

Referring to FIG. 8A and FIG. 8B, a green color filter 230G may be formed at the position overlapping the emission layer 350 of the light emitting diode corresponding to the green pixel in the display area DA. The green color filter 230G may be formed so that the edge covers at least part of the upper surface of the sensing electrodes 520 and 540.

The green color filter 230G may be formed in the non-display area NA. The green color filter 230G of the non-display area NA and the green color filter 230G of the display area DA may be formed with a same material and a same method on a same layer. For example, in case that the green color filter 230G is formed on sensing electrodes 520 and 540 in the display area DA, the green color filter 230G may be formed between the adjacent upper pad electrodes 530 and 531 in the non-display area NA. The green color filter 230G may be formed to cover the upper surface of the lower planarization layer 180 and to be in contact with the side surface of the upper pad electrodes 530 and 531.

Figure 9A:
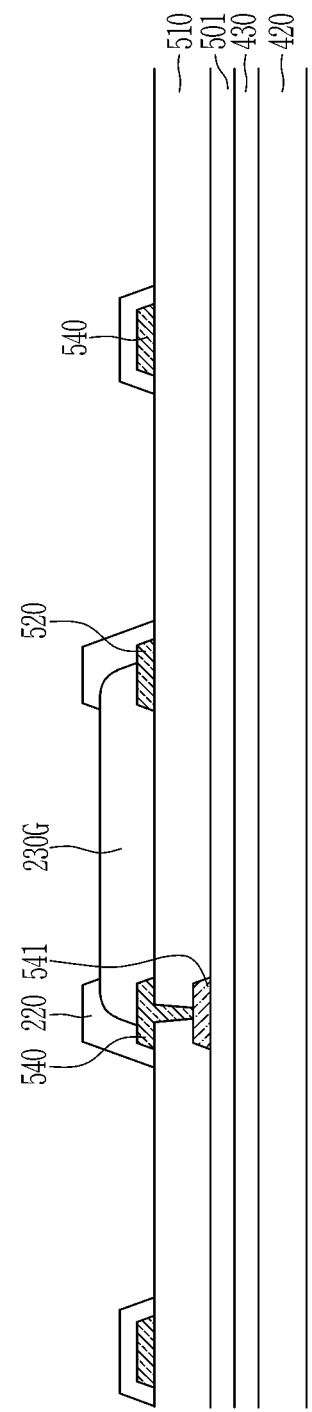
Figure 9B:
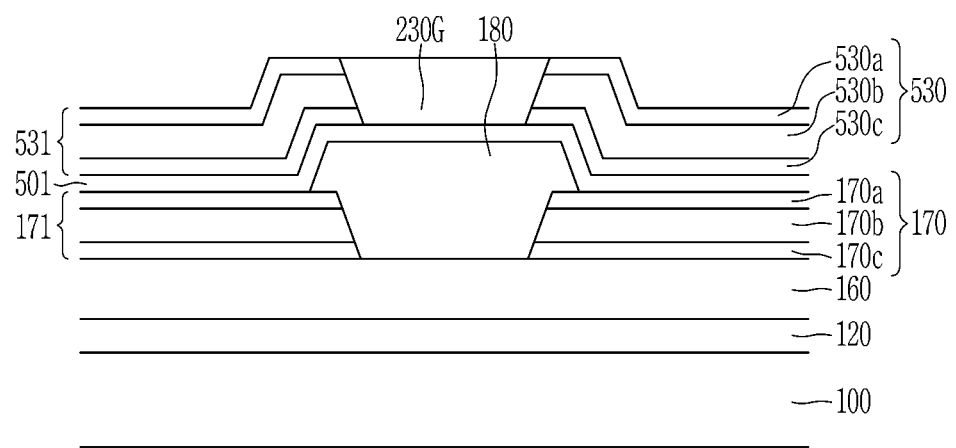

Referring to FIG. 9A and FIG. 9B, a light blocking part 220 may be formed at the position overlapping sensing electrodes 520 and 540 in the display area DA. The light blocking part 220 may be formed on the green color filter 230G at the edge of the green color filter 230G. The light blocking part 220 may be formed to overlap the sensing electrodes 520 and 540 and to not overlap the emission layer 350. The light blocking part 220 may not be formed in the non-display area NA.

Figure 10A:
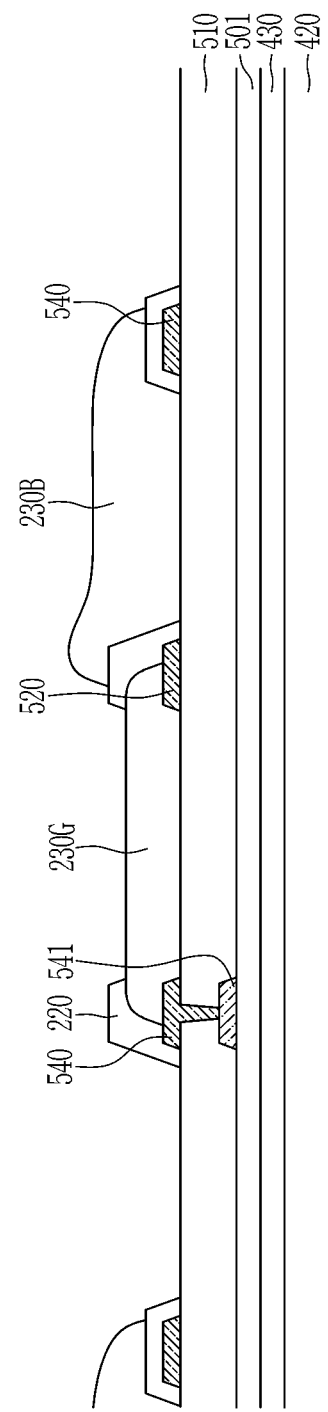
Figure 10B:
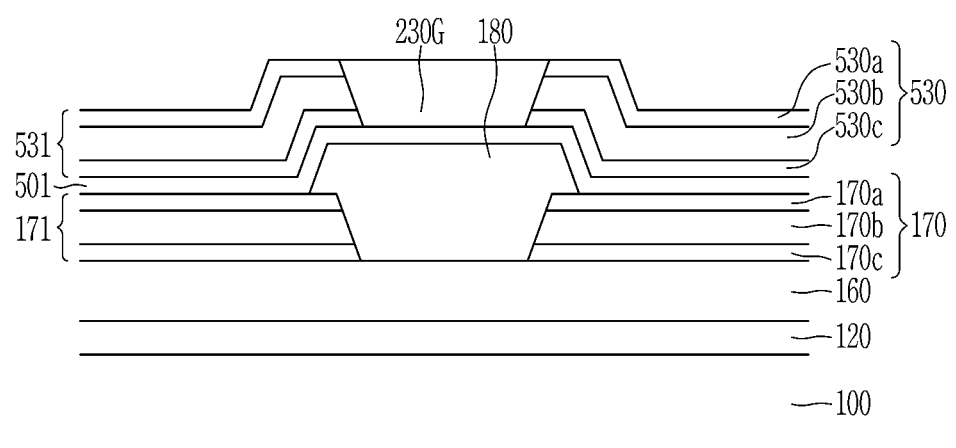

Referring to FIG. 10A and FIG. 10B, a blue color filter 230B may be formed at the position overlapping the emission layer 350 of the light emitting diode corresponding to the blue pixel of the display area DA. The blue color filter 230B may be formed so that the edge covers at least part of the upper surface of the light blocking part 220. In the non-display area NA, the blue color filter 230B may not be formed.

Figure 11A:
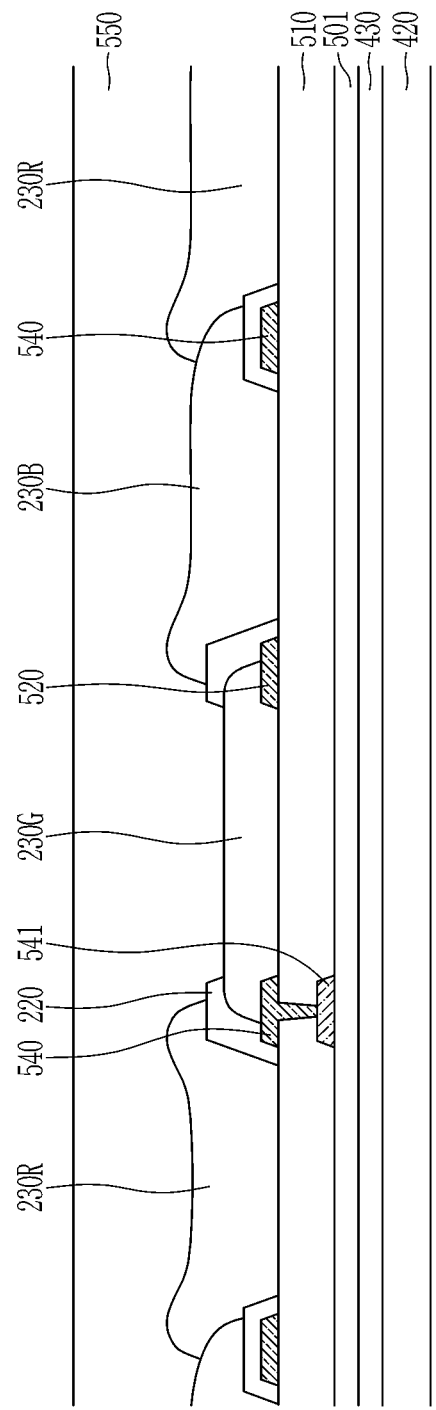
Figure 11B:
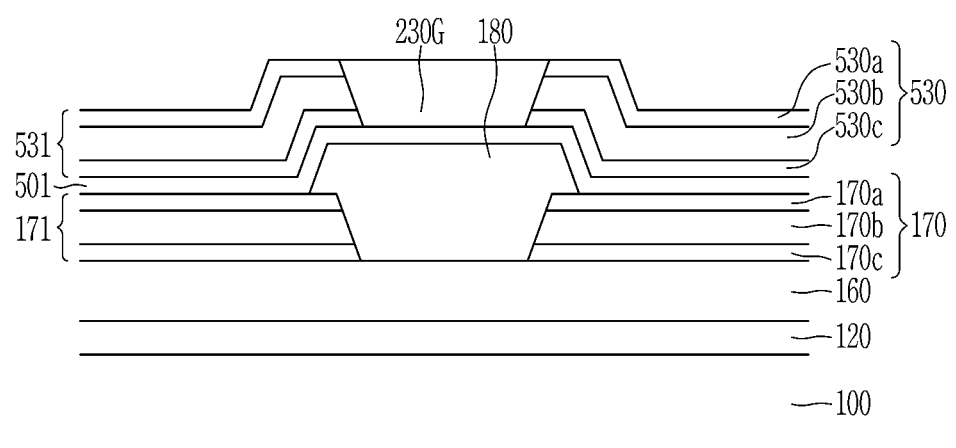

Referring to FIG. 11A and FIG. 11B, a red color filter 230R may be formed at the position overlapping the emission layer 350 of the light emitting diode corresponding to the red pixel in the display area DA. The red color filter 230R may be formed so that the edge covers at least part of the upper surface of the light blocking part 220 and at least part of the upper surface of the blue color filter 230B. The red color filter 230R may not be formed in the non-display area NA. After forming the red color filter 230R, an upper planarization layer 550 may be formed.

Hereinafter, a configuration of the pad part 30 of FIG. 4 according to another embodiment is described with reference to FIG. 12 and FIG. 13. Differences from the embodiment described with reference to FIG. 4 to FIG. 6 are described.

Figure 12:
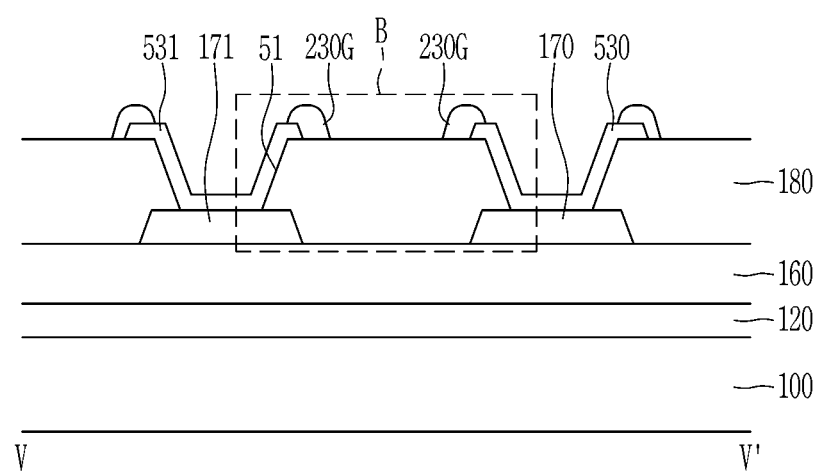
FIG. 12 is a schematic cross-sectional view of a pad part of a light emitting display device according to another embodiment of FIG. 3 taken along line V-V' of FIG. 4.

FIG. 12 is a schematic cross-sectional view of a pad part of a light emitting display device according to another embodiment of FIG. 3 taken along line V-V' of FIG. 4. FIG. 13 is a view schematically illustrating portion B in FIG. 12 in detail.

Figure 13:
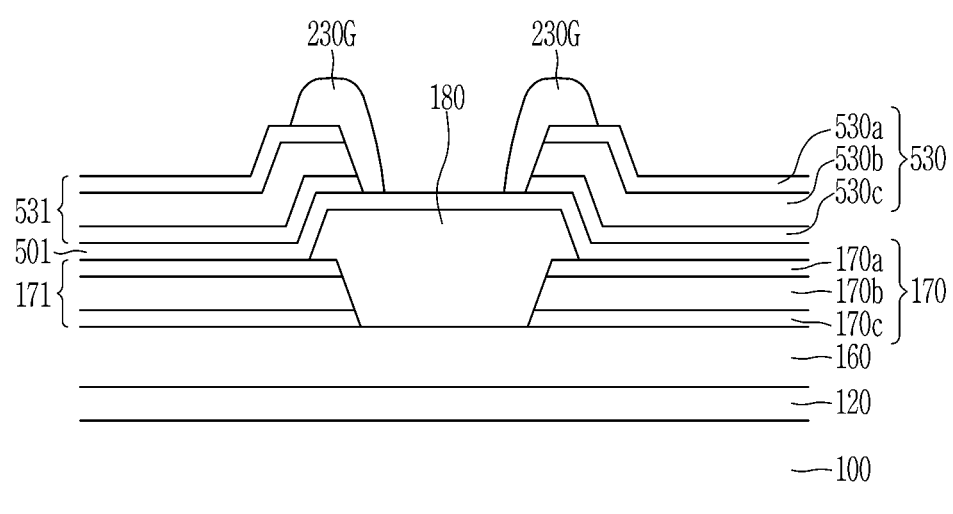
FIG. 13 is a view schematically illustrating in detail portion B in FIG. 12.

Referring to FIG. 12 and FIG. 13, the green color filter 230G may cover the edge and side surfaces of the upper pad electrodes 530 and 531. The green color filter 230G may be disposed between the adjacent upper pad electrodes 530 and 531, but the exposed upper surface of the lower planarization layer 180 may not be completely covered. The green color filter 230G covering the edge and side surfaces of the first upper pad electrode 530 and the green color filter 230G covering the edge and side surfaces of the adjacent second upper pad electrode 531 may be physically divided. The color filter may be generally an insulator, but it may have conductivity depending on the type of an included material or impurity. By physically separating the adjacent green color filters 230G, a short between the adjacent pads PAD may be prevented.

The green color filter 230G may be in contact with the side surface of the upper pad electrodes 530 and 531 so that the middle layer 530b of the upper pad electrodes 530 and 531 may not be exposed to the outside. The green color filter 230G may serve as a covering layer that prevents the middle layer 530b of the upper pad electrodes 530 and 531 from being exposed to the outside, so that the middle layer 530b including aluminum (Al) may not suffer damage that may occur in subsequent processes.

Hereinafter, the manufacturing method of the light emitting display device including the display area of FIG. 3 and the pad part 30 of FIG. 12 and FIG. 13 is described with reference to FIG. 14A to FIG. 17B. In order to simplify the drawing and clearly explain the characteristics of the embodiment, the structure under the organic encapsulation layer 420 may be omitted in the display area DA.

FIG. 14A to FIG. 17B are views schematically showing a manufacturing method of a light emitting display device according to an embodiment. FIG. 14A, FIG. 15A, FIG. 16A, and FIG. 17A correspond to the display area DA of the light emitting display device described in FIG. 3, and FIG. 14B, FIG. 15B, FIG. 16B, and FIG. 17B correspond to the non-display area NA of the light emitting display device described in FIG. 13.

Figure 14A:
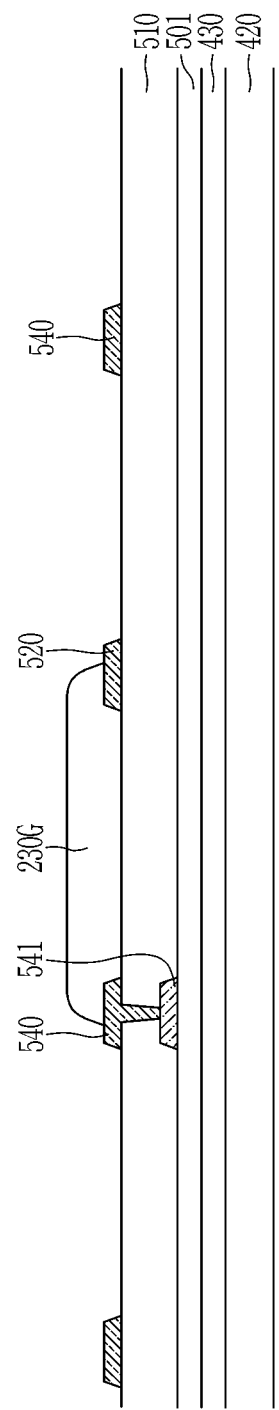
FIG. 14A to FIG. 17B are views schematically showing a manufacturing method of a light emitting display device according to an embodiment.
Figure 14B:
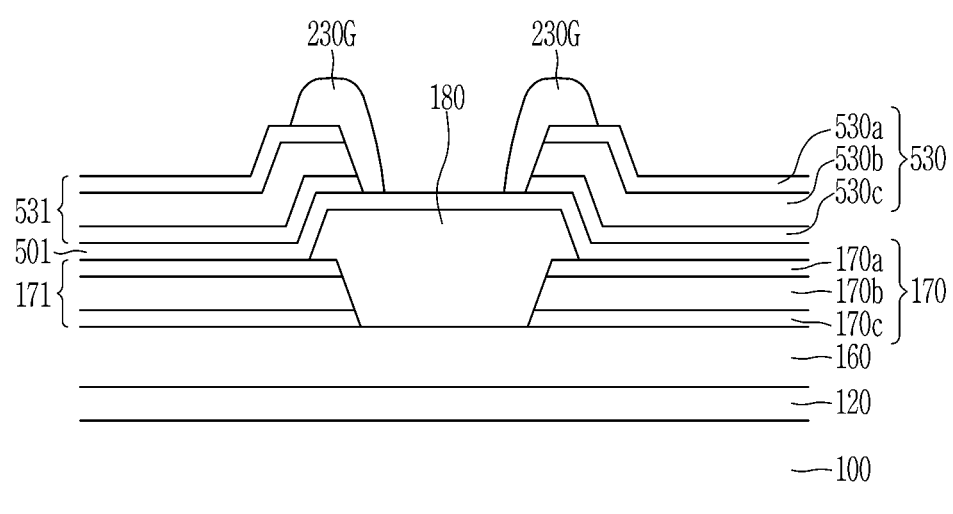

Referring to FIG. 14A and FIG. 14B, in the display area DA, a buffer layer 501, a second sensing electrode connection 541, a sensing insulating layer 510, and sensing electrodes 520 and 540 may be sequentially stacked on an encapsulation layer 400. Hereinafter, an organic encapsulation layer 420 and a second inorganic encapsulation layer 430 included in the encapsulation layer 400 are shown. A green color filter 230G may be formed at the position overlapping the emission layer 350 of the light emitting diode corresponding to the green pixel. The green color filter 230G may be formed so that the edge covers at least part of the upper surface of the sensing electrodes 520 and 540.

In the non-display area NA, a gate insulating layer 120 and an interlayer insulating layer 160 may be sequentially stacked on the substrate 100. Lower pad electrodes 170 and 171 may be formed in the non-display area NA. Lower pad electrodes 170 and 171 and the source electrode 173 and the drain electrode 175 of the display area DA may be formed with a same material and a same method on a same layer. Upper pad electrodes 530 and 531 may be formed in the non-display area NA. Upper pad electrodes 530 and 531 and the sensing electrodes 520 and 540 of the display area DA may be formed with a same material and a same method on a same layer. The lower planarization layer 180 disposed between the upper pad electrodes 530 and 531 and the lower pad electrodes 170 and 171 in the non-display area NA may be the same as the lower planarization layer 180 of the display area DA, and the lower planarization layer 180 may be entirely formed over the display area DA and the non-display area NA. The buffer layer 501 of the non-display area NA may be the same as the buffer layer 501 of the display area DA, and the buffer layer 501 may be entirely formed over the display area DA and the non-display area NA.

A green color filter 230G and the green color filter 230G of the display area DA in the non-display area NA may be formed of a same material, same method, and same layer. The green color filter 230G may be formed to cover the edge and side surfaces of the upper pad electrodes 530 and 531. The green color filter 230G may be disposed between the adjacent upper pad electrodes 530 and 531. However, the exposed upper surface (or the upper surface of the buffer layer 501) of the lower planarization layer 180 may not all be covered and part of the upper surface may be covered. The green color filter 230G may be in contact with the side surface of the upper pad electrodes 530 and 531 so that the middle layer 530b of the upper pad electrodes 530 and 531 may not be exposed to the outside.

Figure 15A:
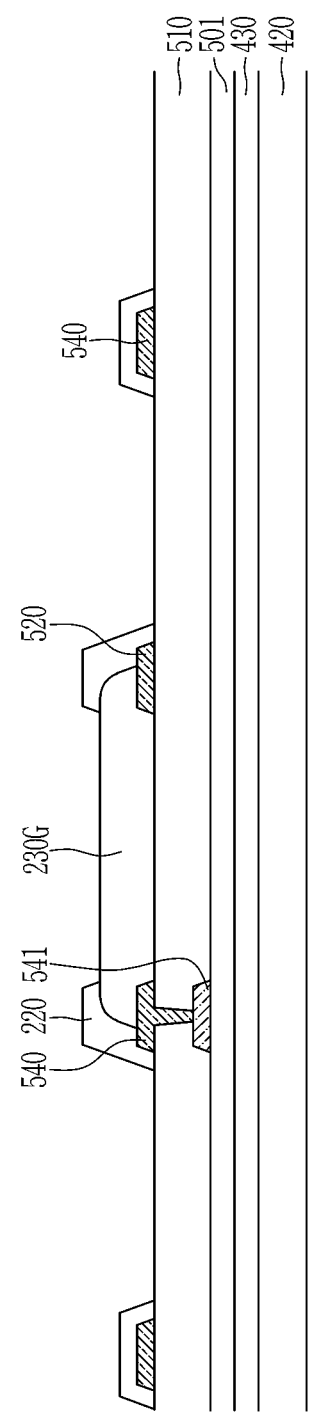
Figure 15B:
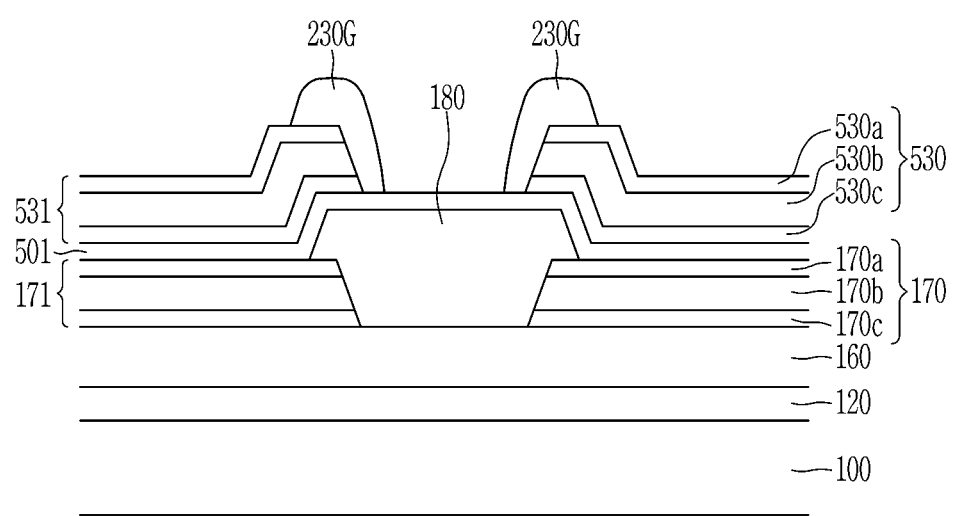

Referring to FIG. 15A and FIG. 15B, a light blocking part 220 may be formed at the position overlapping sensing electrodes 520 and 540 in the display area DA. The light blocking part 220 may be formed on the green color filter 230G on the edge of the green color filter 230G. The light blocking part 220 may be formed to overlap the sensing electrodes 520 and 540 and to not overlap the emission layer 350. The light blocking part 220 may not be formed in the non-display area NA.

Figure 16A:
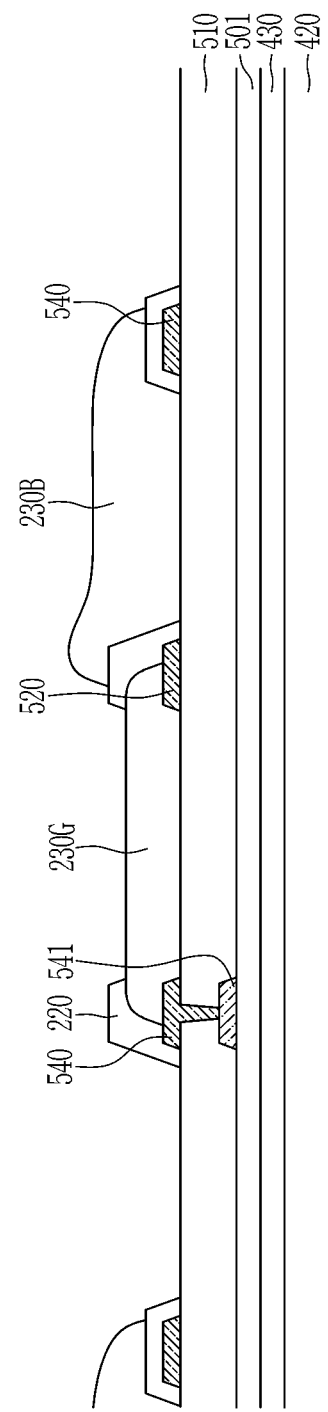
Figure 16B:
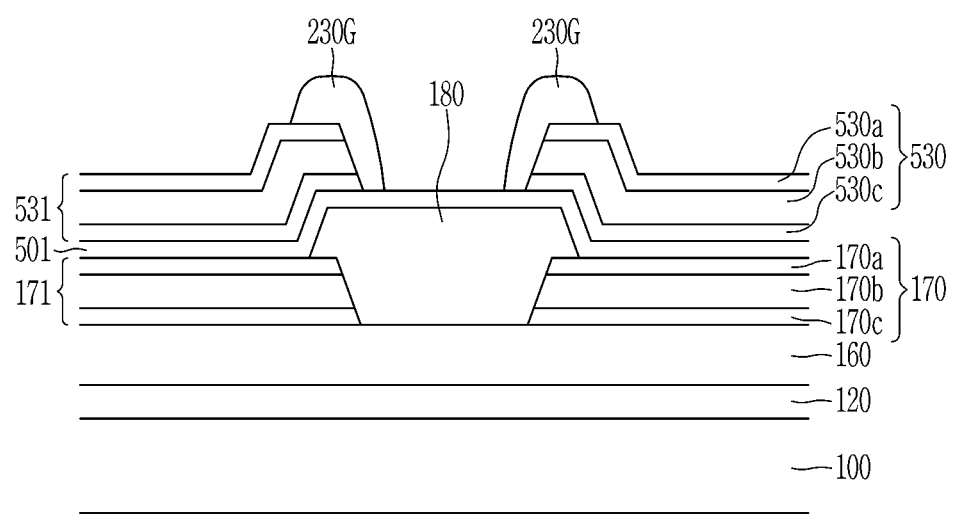

Referring to FIG. 16A and FIG. 16B, a blue color filter 230B may be formed at the position overlapping the emission layer 350 of the light emitting diode corresponding to the blue pixel in the display area DA. The blue color filter 230B may be formed so that the edge covers at least part of the upper surface of the light blocking part 220. The blue color filter 230B may not be formed in the non-display area NA.

Figure 17A:
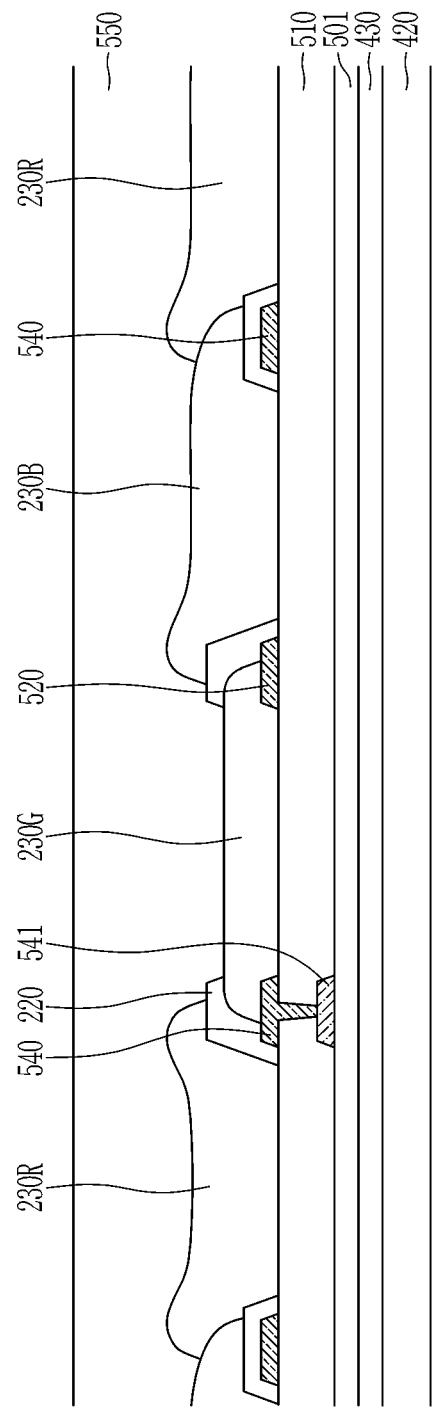
Figure 17B:
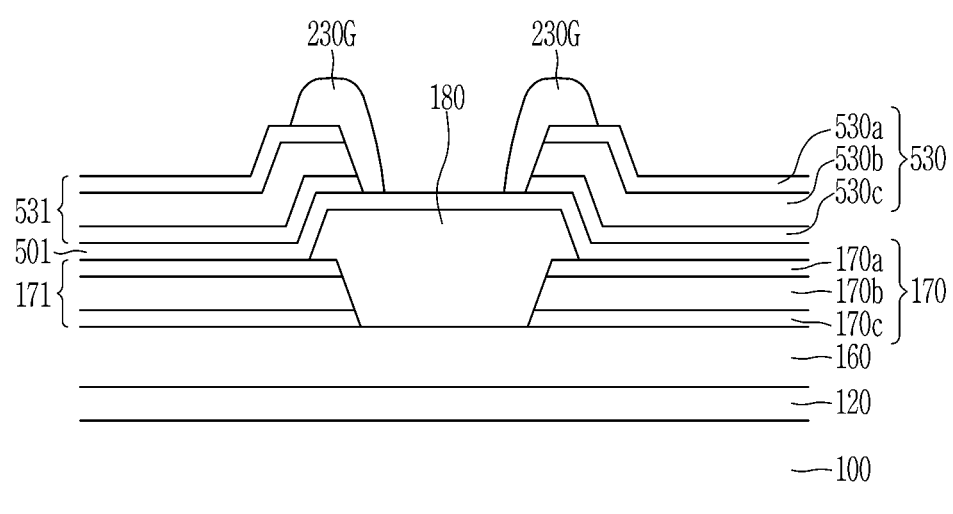

Referring to FIG. 17A and FIG. 17B, a red color filter 230R may be formed at the position overlapping the emission layer 350 of the light emitting diode corresponding to the red pixel in the display area DA. The red color filter 230R may be formed so that the edge covers at least part of the upper surface of the light blocking part 220 or at least part of the upper surface of the blue color filter 230B. The red color filter 230R may not be formed in the non-display area NA. After forming the red color filter 230R, the upper planarization layer 550 may be formed.

A configuration of the pad part 30 of FIG. 4 according to another embodiment is described with reference to FIG. 18 and FIG. 19. The description is focused on differences from the embodiment described with reference to FIG. 12 and FIG. 13.

Figure 18:
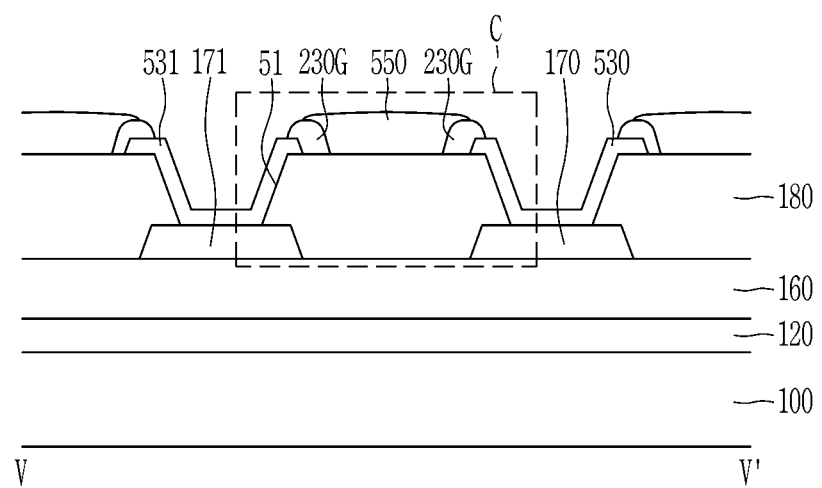
FIG. 18 is a schematic cross-sectional view of a pad part of a light emitting display device according to another embodiment of FIG. 3 taken along line V-V' of FIG. 4.

FIG. 18 is a schematic cross-sectional view of a pad part of a light emitting display device according to another embodiment of FIG. 3 taken along line V-V' of FIG. 4. FIG. 19 is a view schematically illustrating portion C in FIG. 18 in detail.

Figure 19:
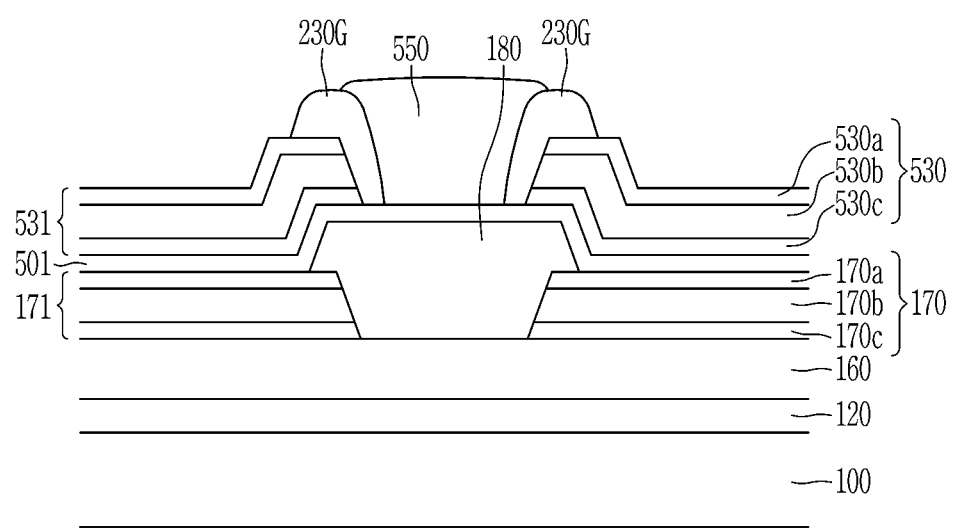
FIG. 19 is a view schematically illustrating portion C in FIG. 18 in detail.

Referring to FIGS. 18 and 19, compared with the embodiment described with reference to FIG. 12 and FIG. 13, the embodiment of FIG. 18 and FIG. 19 may further include an upper planarization layer 550 covering the part between the green color filter 230G covering the edge and side surfaces of the first upper pad electrode 530 and the green color filter 230G covering the edge and side surfaces of the adjacent second upper pad electrode 531. The upper planarization layer 550 may cover part of the green color filter 230G and the exposed upper surface of the lower planarization layer 180. For example, the upper planarization layer 550 may cover the remaining upper surface of the lower planarization layer 180 that may not be covered by the covering layer. The upper planarization layer 550 of the non-display area NA and the upper planarization layer 550 of the display area DA may be formed with a same material and a same method in a same layer.

The manufacturing method of the light emitting display device including the display area of FIG. 3 and the pad part 30 of FIG. 18 and FIG. 19 may further include a process for forming the upper planarization layer 550 in the non-display area NA in case of forming the upper planarization layer 550 of the display area DA in addition to the method described in FIG. 14A to FIG. 17B.

Figure 20:
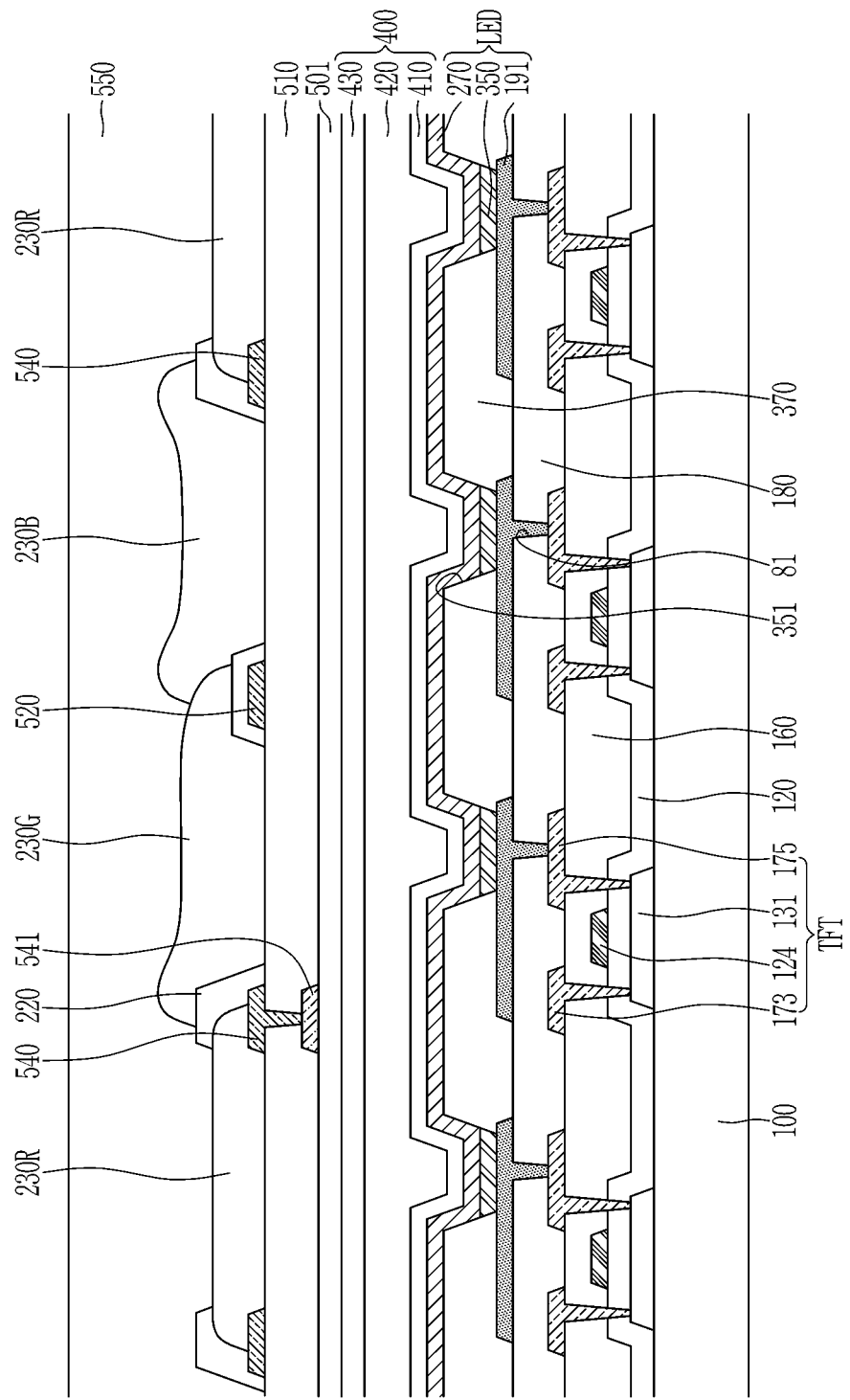
FIG. 20 is a schematic cross-sectional view showing a part of a display area in a light emitting display device according to another embodiment.

Hereinafter, the structure of the display area DA of the light emitting display device according to another embodiment is described with reference to FIG. 20. An embodiment of the structure of the non-display area NA of the light emitting display device according to the embodiment of FIG. 20 is described with reference to FIG. 21 and FIG. 22. Another embodiment of the structure of the non-display area NA of the light emitting display device according to the embodiment of FIG. 20 is described with reference to FIG. 23 and FIG. 24. A further embodiment of the structure of the non-display area NA of the light emitting display device according to the embodiment of FIG. 20 is described with reference to FIG. 25 and FIG. 26. Hereinafter, a description is provided based on differences from the above-described embodiments.

FIG. 20 is a schematic cross-sectional view showing a part of a display area in a light emitting display device according to another embodiment.

Referring to FIG. 20, a red color filter 230R, a light blocking part 220, a green color filter 230G, and a blue color filter 230B may be sequentially stacked on sensing electrodes 520 and 540. The edge of the red color filter 230R may cover at least part of the upper surface of sensing electrodes 520 and 540. The light blocking part 220 may be disposed on the red color filter 230R, and the green color filter 230G and the blue color filter 230B may be disposed on the light blocking part 220.

Figure 21:
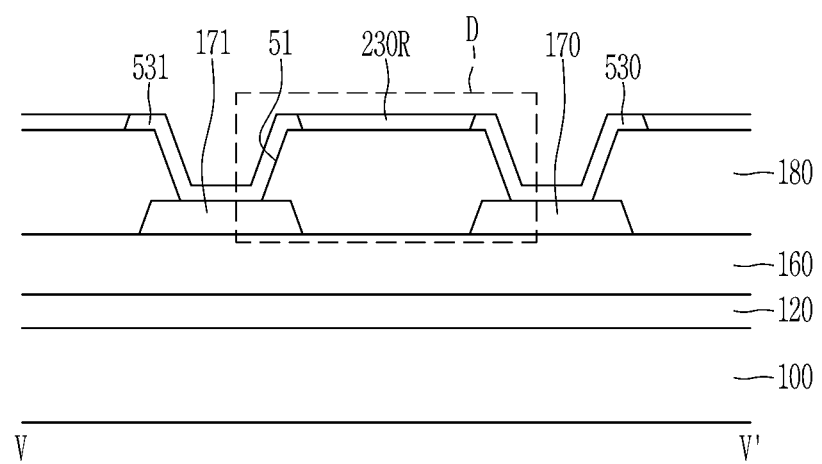
FIG. 21 is a cross-sectional view of a pad part of a light emitting display device according to an embodiment of FIG. 20 taken along line V-V' of FIG. 4.
Figure 22:
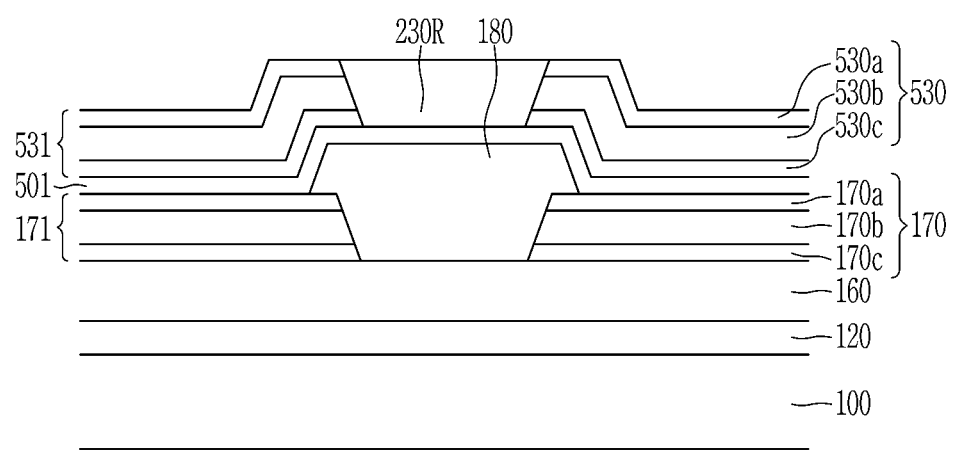
FIG. 22 is a view schematically illustrating in detail portion D in FIG. 21.

FIG. 21 is a cross-sectional view of a pad part of a light emitting display device according to an embodiment of FIG. 20 taken along line V-V' of FIG. 4. FIG. 22 is a view schematically illustrating portion D in FIG. 21 in detail.

Referring to FIG. 21 and FIG. 22, compared with the embodiment of FIG. 5 and FIG. 6, a red color filter 230R may be disposed between the adjacent upper pad electrodes 530 and 531. The red color filter 230R may cover the exposed upper surface of the lower planarization layer 180 and may be in contact with the side surface of the upper pad electrodes 530 and 531, thereby serving as a covering layer to prevent the middle layer 530b of the upper pad electrodes 530 and 531 from being exposed to the outside. For example, the red color filter 230R may be in contact with each side surface of the upper layer 530a, the middle layer 530b, and the lower layer 530c of the upper pad electrodes 530 and 531. Accordingly, the middle layer 530b including aluminum (Al) may be prevented from receiving damage that may occur in the subsequent processes.

The red color filter 230R of FIG. 21 and FIG. 22 may be formed together in case of forming the red color filter 230R of FIG. 20. The red color filter 230R of FIG. 21 and FIG. 22 and the red color filter 230R of FIG. 20 may be formed of a same material.

Figure 23:
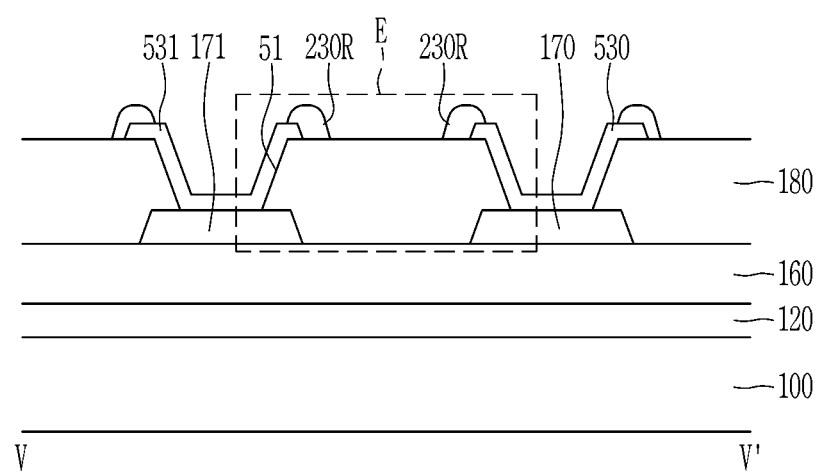
FIG. 23 is a schematic cross-sectional view of a pad part of a light emitting display device according to another embodiment of FIG. 20 taken along line V-V' of FIG. 4.
Figure 24:
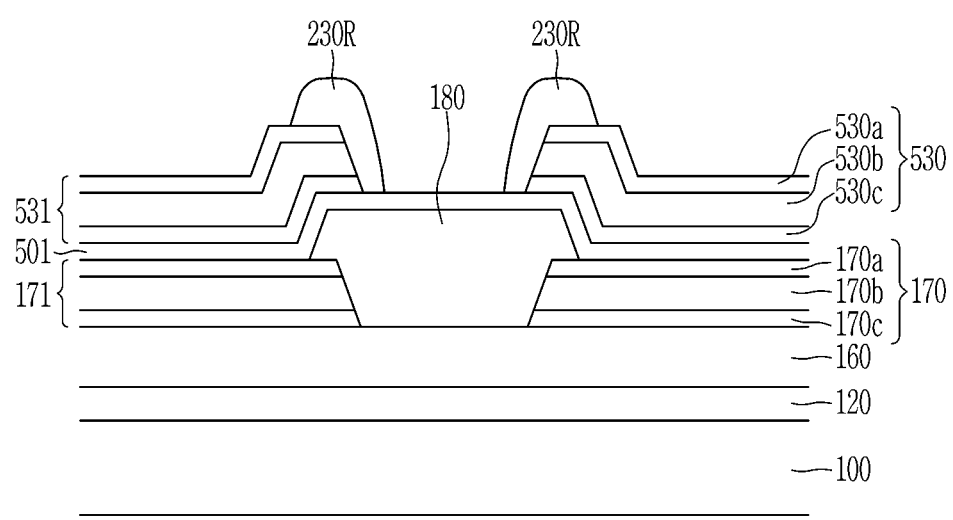
FIG. 24 is a view schematically illustrating portion E in FIG. 23 in detail.

FIG. 23 is a schematic cross-sectional view of a pad part of a light emitting display device according to another embodiment of FIG. 20 taken along line V-V' of FIG. 4. FIG. 24 is a view schematically illustrating portion E in FIG. 23 in detail.

Referring to FIG. 23 and FIG. 24, compared with the embodiment of FIG. 12 and FIG. 13, the red color filter 230R may cover the edge and side surfaces of the upper pad electrodes 530 and 531. The red color filter 230R may be disposed between the adjacent upper pad electrodes 530 and 531, but it may cover part of the upper surface without covering all of the exposed upper surface of the lower planarization layer 180. The red color filter 230R covering the edge and side surfaces of the first upper pad electrode 530 and the red color filter 230R covering the edge and side surfaces of the adjacent second upper pad electrode 531 may be physically separated. By physically separating the adjacent red color filters 230R, a short between the adjacent pads PAD may be prevented.

The red color filter 230R may be in contact with the side surfaces of the upper pad electrodes 530 and 531 so that the middle layer 530b of the upper pad electrodes 530 and 531 may not be exposed to the outside. The red color filter 230R serves as a covering layer that prevents the middle layer 530b of the upper pad electrodes 530 and 531 from being exposed to the outside, so that the middle layer 530b including aluminum (Al) may not suffer damage that may occur in subsequent processes.

The red color filter 230R shown in FIG. 23 and FIG. 24 may be formed together in case of forming the red color filter 230R of FIG. 20. The red color filter 230R shown in FIG. 23 and FIG. 24 and the red color filter 230R of FIG. 20 may be formed of a same material.

Figure 25:
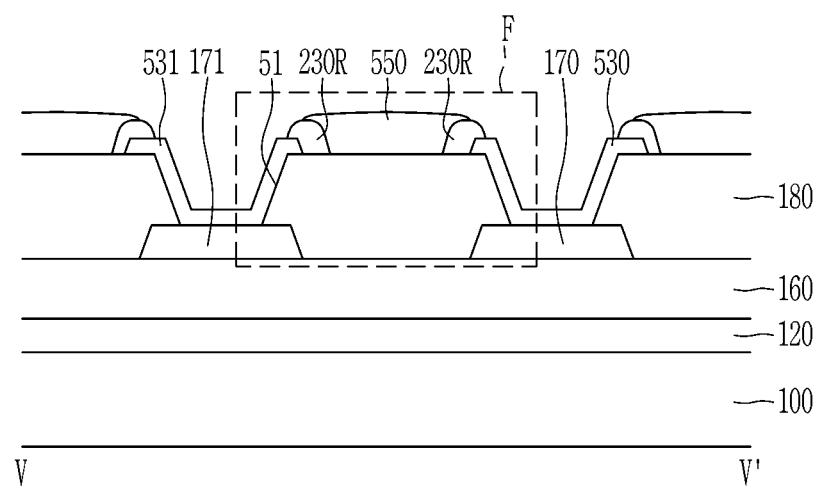
FIG. 25 is a schematic cross-sectional view of a pad part of a light emitting display device according to another embodiment of FIG. 20 taken along line V-V' of FIG. 4.
Figure 26:
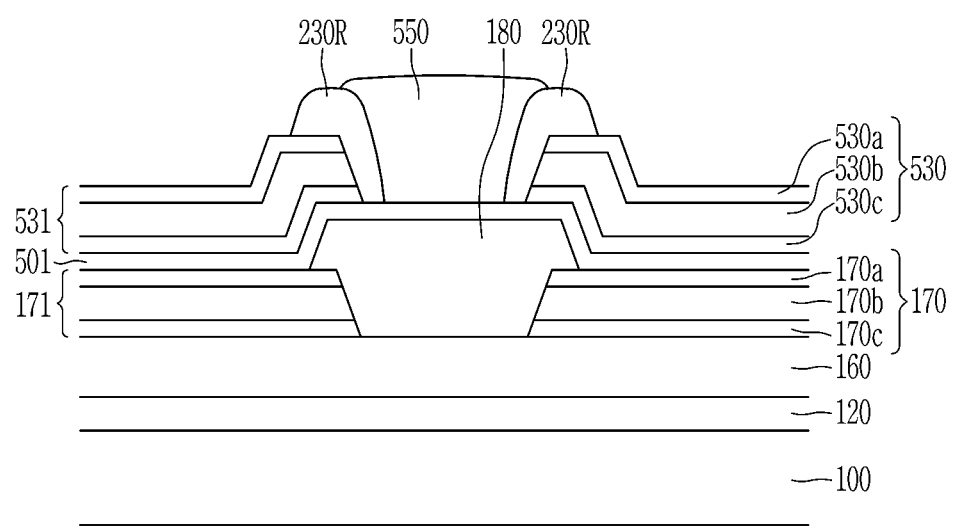
FIG. 26 is a view schematically illustrating portion F in FIG. 25 in detail.

FIG. 25 is a schematic cross-sectional view of a pad part of a light emitting display device according to another embodiment of FIG. 20 taken along line V-V' of FIG. 4. FIG. 26 is a view schematically illustrating portion F in FIG. 25 in detail.

Referring to FIG. 25 and FIG. 26, compared with the embodiment of FIG. 23 and FIG. 24, the upper planarization layer 550 may cover the part between the red color filter 230R covering the edge and side surfaces of the first upper pad electrode 530 and the red color filter 230R covering the edge and side surfaces of the adjacent second upper pad electrode 531. The upper planarization layer 550 may cover part of the red color filter 230R and the exposed upper surface of the lower planarization layer 180. The upper planarization layer 550 of the non-display area NA and the upper planarization layer 550 of the display area DA may be formed of a same material and with a same method in a same layer.

Figure 27:
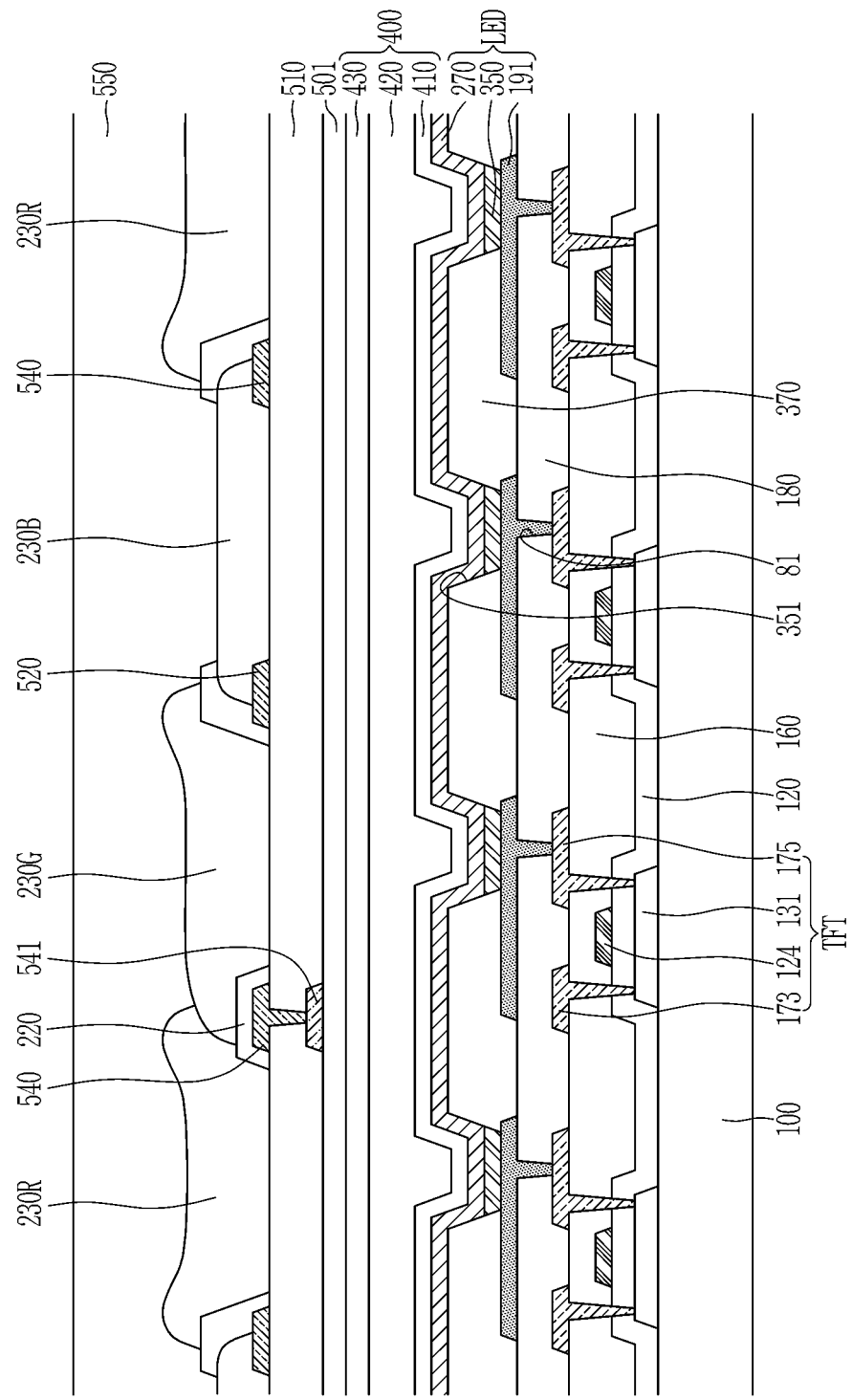
FIG. 27 is a schematic cross-sectional view of a part of a display area in a light emitting display device according to another embodiment.

Hereinafter, the structure of the display area DA of the light emitting display device according to another embodiment is described with reference to FIG. 27. An embodiment of the structure of the non-display area NA of the light emitting display device according to the embodiment of FIG. 27 is described with reference to FIG. 28 and FIG. 29. Another embodiment of the structure of the non-display area NA of the light emitting display device according to the embodiment of FIG. 27 is described with reference to FIG. 30 and FIG. 31. Further, another embodiment of the structure of the non-display area NA of the light emitting display device according to the embodiment of FIG. 27 is described with reference to FIG. 32 and FIG. 33. Hereinafter, differences from the above-described embodiment are described.

FIG. 27 is a schematic cross-sectional view of a part of a display area in a light emitting display device according to another embodiment.

Referring to FIG. 27, a blue color filter 230B, a light blocking part 220, a green color filter 230G, and a red color filter 230R may be sequentially stacked on the sensing electrodes 520 and 540. The edge of the blue color filter 230B may cover at least part of the upper surface of the sensing electrodes 520 and 540. The light blocking part 220 may be disposed on the blue color filter 230B, and the green color filter 230G and the red color filter 230R may be disposed on the light blocking part 220.

Figure 28:
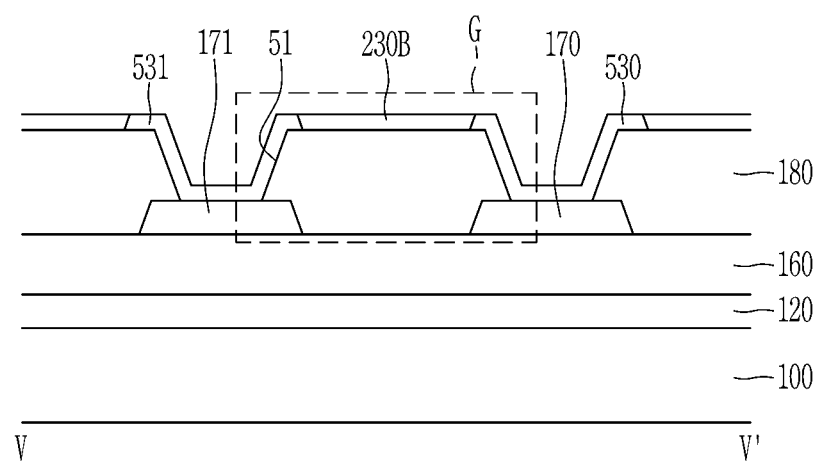
FIG. 28 is a schematic cross-sectional view of a pad part of a light emitting display device according to another embodiment of FIG. 27 taken along line V-V' of FIG. 4.
Figure 29:
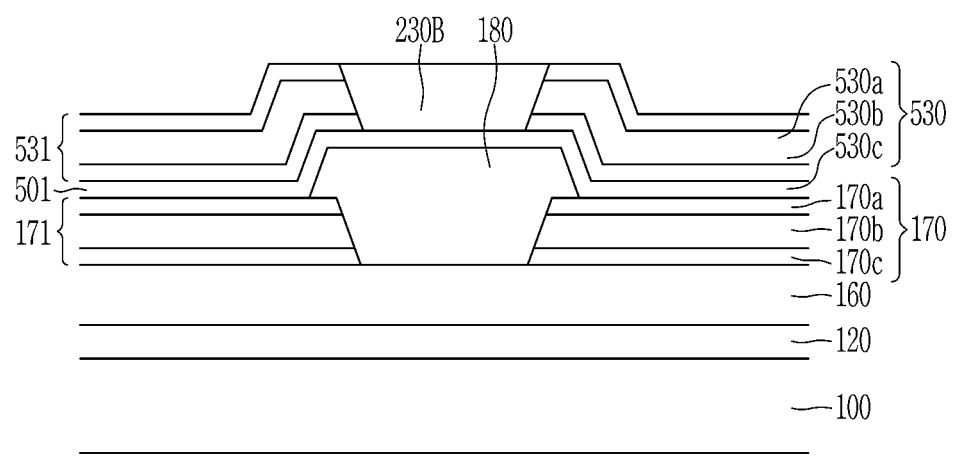
FIG. 29 is a view schematically illustrating portion G in FIG. 28 in detail.

FIG. 28 is a schematic cross-sectional view of a pad part of a light emitting display device according to another embodiment of FIG. 27 taken along line V-V' of FIG. 4. FIG. 29 is a view schematically illustrating portion G in FIG. 28 in detail.

Referring to FIG. 28 and FIG. 29, compared with the embodiment of FIG. 5 and FIG. 6, the blue color filter 230B may be disposed between the adjacent upper pad electrodes 530 and 531. The blue color filter 230B may cover the exposed upper surface of the lower planarization layer 180 and may be in contact with the side surface of the upper pad electrodes 530 and 531, thereby serving as a covering layer to prevent the middle layer 530b of the upper pad electrodes 530 and 531 from being exposed to the outside. For example, the blue color filter 230B may be in contact with each side surface of the upper layer 530a, the middle layer 530b, and the lower layer 530c of the upper pad electrodes 530 and 531. Accordingly, the middle layer 530b including aluminum (Al) may be prevented from receiving damage that may occur in the subsequent processes.

The blue color filter 230B of FIG. 28 and FIG. 29 may be formed together in case of forming the blue color filter 230B of FIG. 27. The blue color filter 230B of FIG. 28 and FIG. 29 and the blue color filter 230B of FIG. 27 may be formed of a same material.

Figure 30:
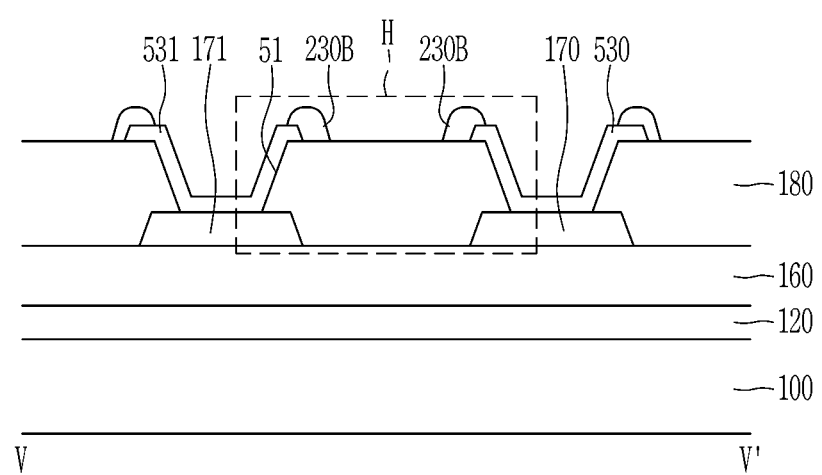
FIG. 30 is a schematic cross-sectional view of a pad part of a light emitting display device according to another embodiment of FIG. 27 taken along line V-V' of FIG. 4.
Figure 31:
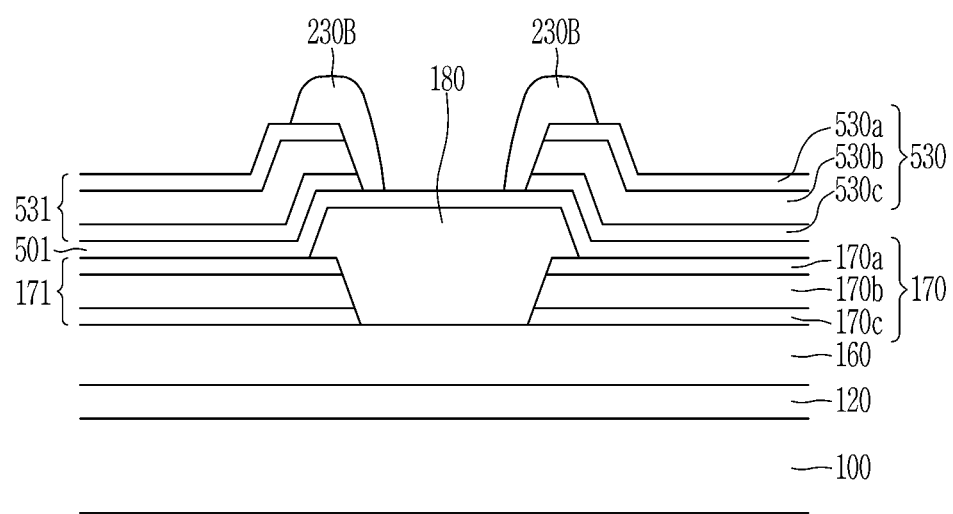
FIG. 31 is a view schematically illustrating portion H in FIG. 30 in detail.

FIG. 30 is a schematic cross-sectional view of a pad part of a light emitting display device according to another embodiment of FIG. 27 taken along a line V-V' of FIG. 4. FIG. 31 is a view schematically illustrating portion H in FIG. 30 in detail.

Referring to FIG. 30 and FIG. 31, compared with the embodiment of FIG. 12 and FIG. 13, the blue color filter 230B may cover the edge and side surfaces of the upper pad electrodes 530 and 531. The blue color filter 230B may be disposed between the adjacent upper pad electrodes 530 and 531, but it may cover part of the upper surface without covering all of the exposed upper surface of the lower planarization layer 180. The blue color filter 230B covering the edge and side surfaces of the first upper pad electrode 530 and the blue color filter 230B covering the edge and side surfaces of the adjacent second upper pad electrode 531 may be physically separated. By physically separating the adjacent blue color filters 230B, a short between the adjacent pads PAD may be prevented.

The blue color filter 230B may be in contact with the side surfaces of the upper pad electrodes 530 and 531 so that the middle layer 530b of the upper pad electrodes 530 and 531 may not be exposed to the outside. The blue color filter 230B may serve as a covering layer that prevents the middle layer 530b of the upper pad electrodes 530 and 531 from being exposed to the outside, so that the middle layer 530b including aluminum (Al) may not suffer damage that may occur in subsequent processes.

The blue color filter 230B of FIG. 30 and FIG. 31 may be formed together in case of forming the blue color filter 230B of FIG. 27. The blue color filter 230B of FIG. 30 and FIG. 31 and the blue color filter 230B of FIG. 27 may be formed of a same material.

Figure 32:
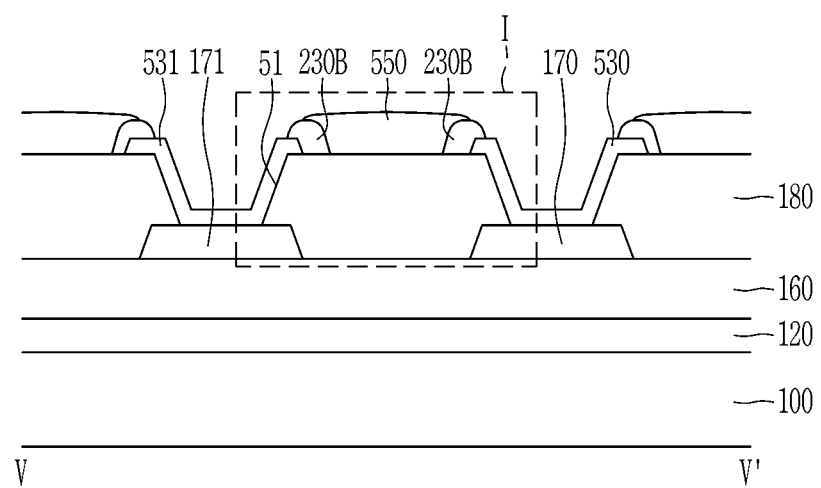
FIG. 32 is a schematic cross-sectional view of a pad part of a light emitting display device according to another embodiment of FIG. 27 taken along line V-V' of FIG. 4.
Figure 33:
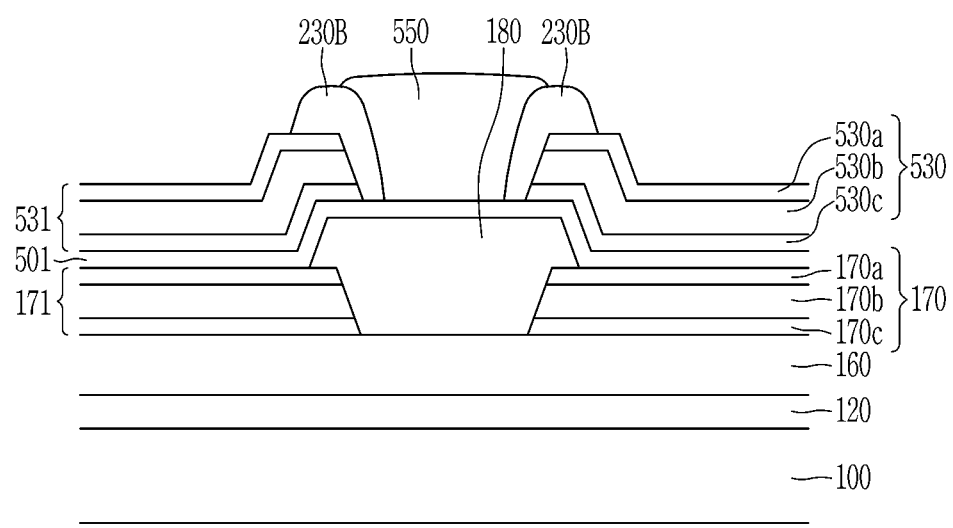
FIG. 33 is a view schematically illustrating in detail a portion in FIG. 32.

FIG. 32 is a schematic cross-sectional view of a pad part of a light emitting display device according to another embodiment of FIG. 27 taken along line V-V' of FIG. 4. FIG. 33 is a view schematically illustrating portion I in FIG. 32 in detail.

Referring to FIG. 32 and FIG. 33, compared with the embodiment of FIG. 30 and FIG. 31, the upper planarization layer 550 may cover the part between the blue color filter 230R covering the edge and side surfaces of the first upper pad electrode 530 and the blue color filter 230B covering the edge and side surface of the adjacent second upper pad electrode 531. The upper planarization layer 550 may cover part of the blue color filter 230B and the exposed upper surface of the lower planarization layer 180. The upper planarization layer 550 of the non-display area NA and the upper planarization layer 550 of the display area DA may be formed of a same material and with a same method in a same layer.

Figure 34:
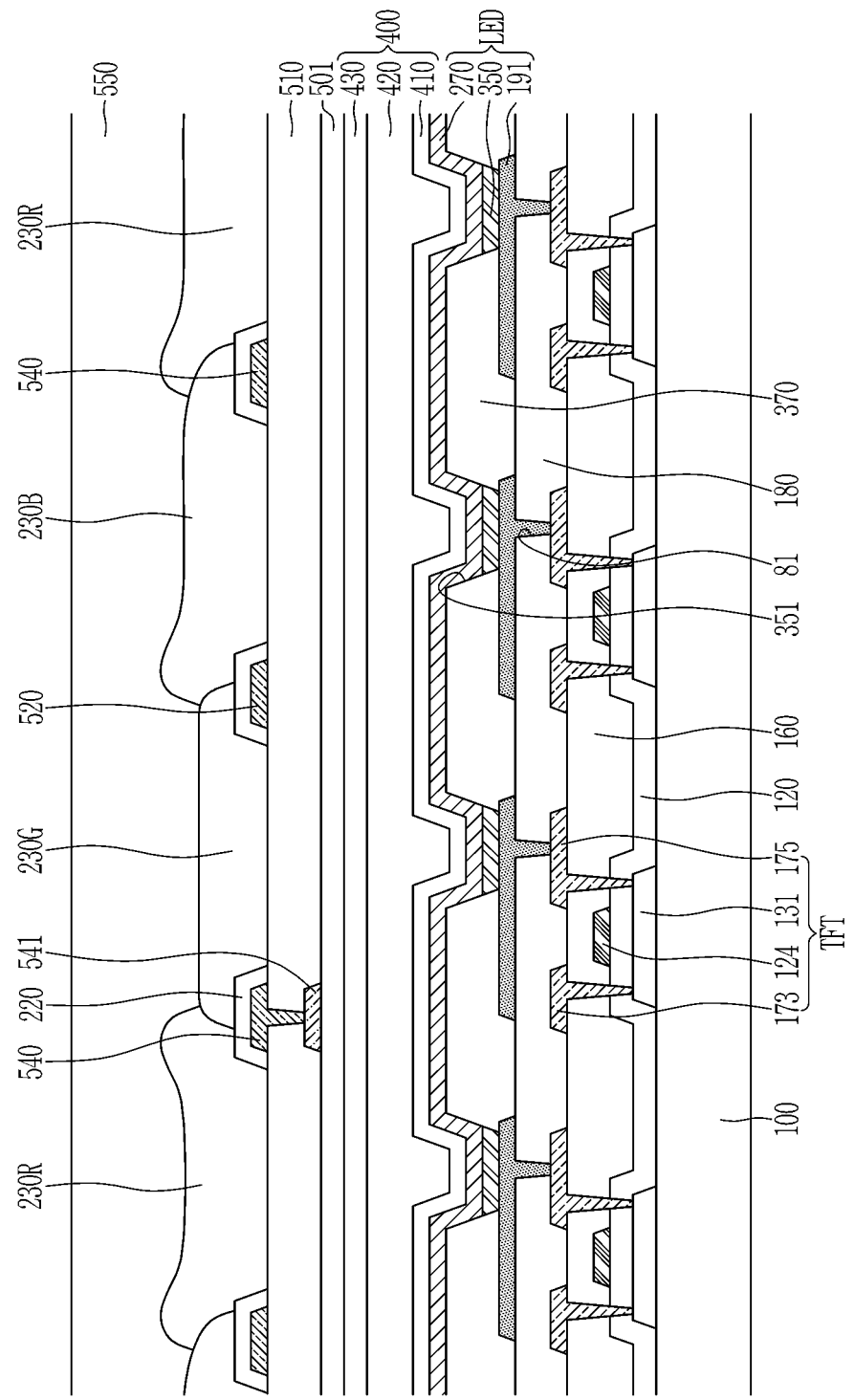
FIG. 34 is a schematic cross-sectional view of a part of a display area in a light emitting display device according to another embodiment.

Hereinafter, the structure of the display area DA of the light emitting display device according to another embodiment is described with reference to FIG. 34. An embodiment of the structure of the non-display area NA of the light emitting display device according to the embodiment of FIG. 34 is described with reference to FIG. 35 and FIG. 36. Another embodiment of the structure of the non-display area NA of the light emitting display device according to the embodiment of FIG. 34 is described with reference to FIG. 37 and FIG. 38. Further, another embodiment of the structure of the non-display area NA of the light emitting display device according to the embodiment of FIG. 34 is described with reference to FIG. 39 and FIG. 40. Hereinafter, differences from the above-described embodiment are described.

FIG. 34 is a cross-sectional view of a part of a display area in a light emitting display device according to another embodiment.

Referring to FIG. 34, a light blocking part 220, a green color filter 230G, a blue color filter 230B, and a red color filter 230R may be sequentially stacked on sensing electrodes 520 and 540. The light blocking part 220 may cover the upper surface of sensing electrodes 520 and 540. A green color filter 230G, a blue color filter 230B, and a red color filter 230R may be disposed on the light blocking part 220.

The light blocking part 220 may be an organic material including a black color pigment, or an insulator including a mixture of an organic material and an inorganic material including a black color pigment. The light blocking part 220 may be an insulator including an organic material without including a conductive material such as carbon. The light blocking part 220 may be an insulator containing a mixture of organic and inorganic materials.

Figure 35:
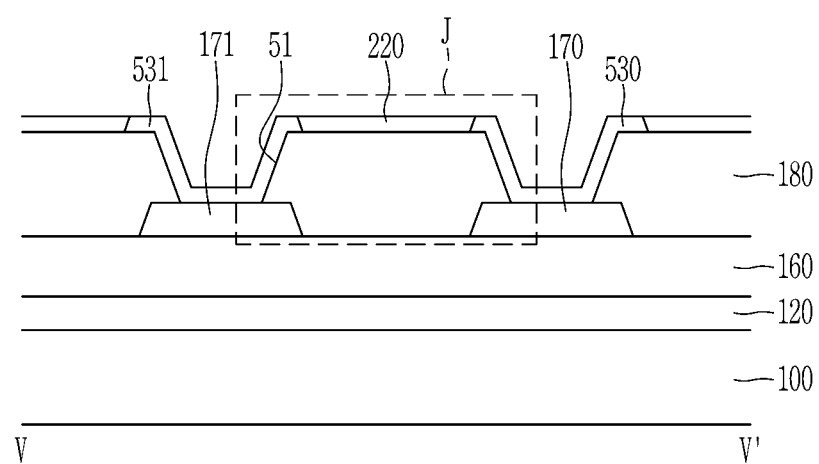
FIG. 35 is a schematic cross-sectional view of a pad part of a light emitting display device according to another embodiment of FIG. 34 taken along line V-V' of FIG. 4.
Figure 36:
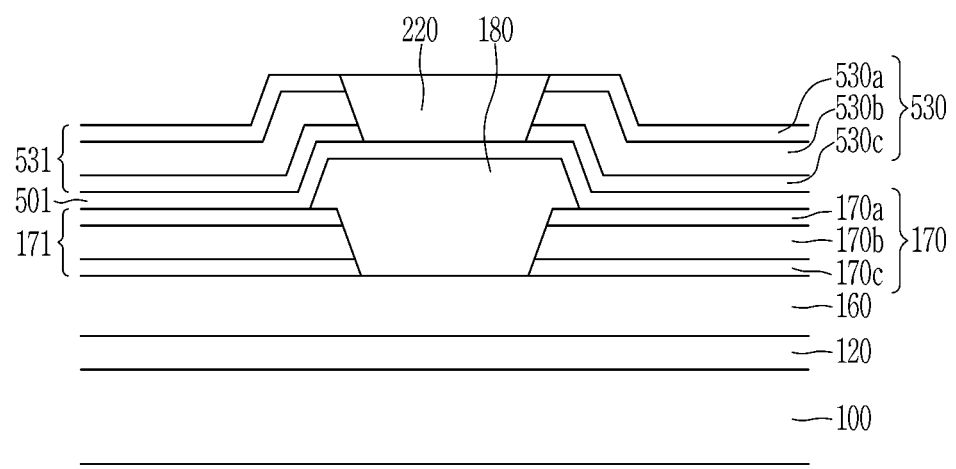
FIG. 36 is a view schematically illustrating portion J in FIG. 35 in detail.

FIG. 35 is a schematic cross-sectional view of a pad part of a light emitting display device according to another embodiment of FIG. 34 taken along line V-V' of FIG. 4. FIG. 36 is a view schematically illustrating portion J in FIG. 35 in detail.

Referring to FIG. 35 and FIG. 36, compared with the embodiment of FIG. 5 and FIG. 6, a light blocking part 220 may be disposed between the adjacent upper pad electrodes 530 and 531. The light blocking part 220 may cover the exposed upper surface of the lower planarization layer 180 and may be in contact with the side surface of the upper pad electrodes 530 and 531, thereby serving as a covering layer to prevent the middle layer 530b of the upper pad electrodes 530 and 531 from being exposed to the outside. For example, the light blocking part 220 may be in contact with each side surface of the upper layer 530a, the middle layer 530b, and the lower layer 530c of the upper pad electrodes 530 and 531. Accordingly, the middle layer 530b including aluminum (Al) may be prevented from receiving damage that may occur in the subsequent processes.

The light blocking part 220 of FIG. 35 and FIG. 36 may be formed together in case of forming the light blocking part 220 of FIG. 34. The light blocking part 220 of FIG. 35 and FIG. 36 and the light blocking part 220 of FIG. 34 may be formed of a same material. Since the light blocking part 220 may be an insulator that may not include a conductive material such as carbon, a short between the pads PAD may be prevented.

Figure 37:
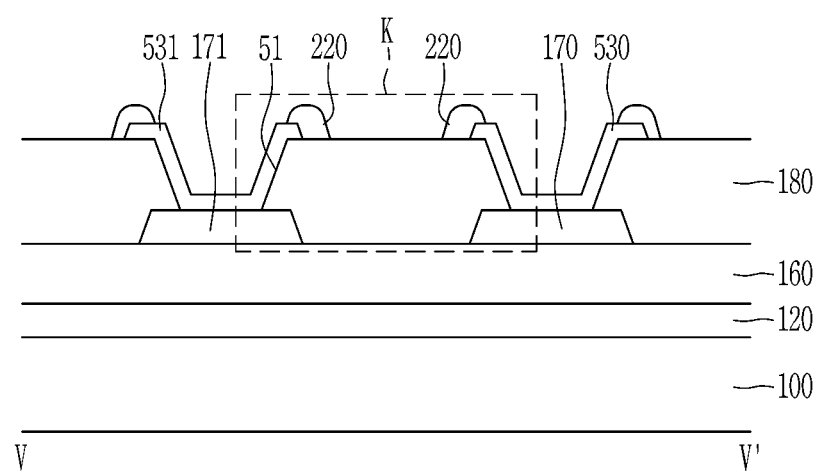
FIG. 37 is a schematic cross-sectional view of a pad part of a light emitting display device according to another embodiment of FIG. 34 taken along line V-V' of FIG. 4.
Figure 38:
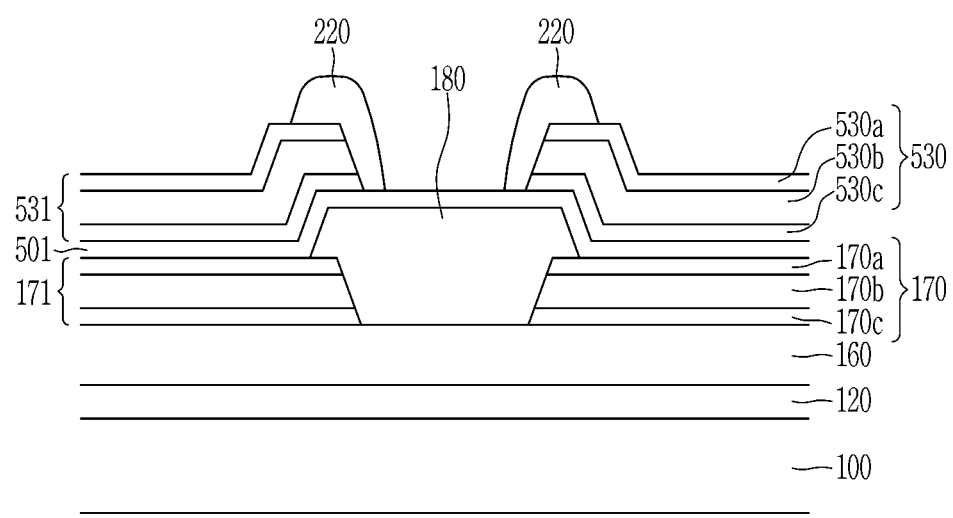
FIG. 38 is a view schematically illustrating portion K in FIG. 37 in detail.

FIG. 37 is a schematic cross-sectional view of a pad part of a light emitting display device according to another embodiment of FIG. 34 taken along line V-V' of FIG. 4. FIG. 38 is a view schematically illustrating portion K in FIG. 37 in detail.

Referring to FIG. 37 and FIG. 38, compared with the embodiment of FIG. 12 and FIG. 13, the light blocking part 220 may cover the edge and side surfaces of the upper pad electrodes 530 and 531. The light blocking part 220 may be disposed between the adjacent upper pad electrodes 530 and 531, but may cover a part of the upper surface without covering all of the exposed upper surface of the lower planarization layer 180. The light blocking part 220 covering the edge and side surfaces of the first upper pad electrode 530 and the light blocking part 220 covering the edge and side surfaces of the adjacent second upper pad electrode 531 may be physically separated. By physically separating the adjacent light blocking parts 220, a short between the adjacent pads PAD may be prevented.

The light blocking part 220 may be in contact with the side surface of the upper pad electrodes 530 and 531 so that the middle layer 530b of the upper pad electrodes 530 and 531 may not be exposed to the outside. The light blocking part 220 serves as a covering layer that prevents the middle layer 530b of upper pad electrodes 530 and 531 from being exposed to the outside, so that the middle layer 530b including aluminum (Al) may not suffer damage that may occur in subsequent processes.

The light blocking part 220 of FIG. 37 and FIG. 38 may be formed together in case of forming the light blocking part 220 of FIG. 34. The light blocking part 220 of FIG. 37 and FIG. 38 and the light blocking part 220 of FIG. 34 may be formed of a same material.

Figure 39:
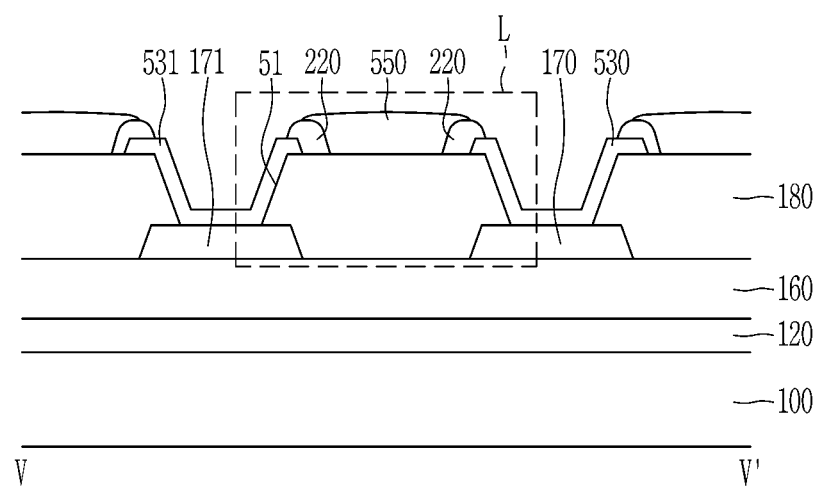
FIG. 39 is a schematic cross-sectional view of a pad part of a light emitting display device according to another embodiment of FIG. 34 taken along line V-V' of FIG. 4.
Figure 40:
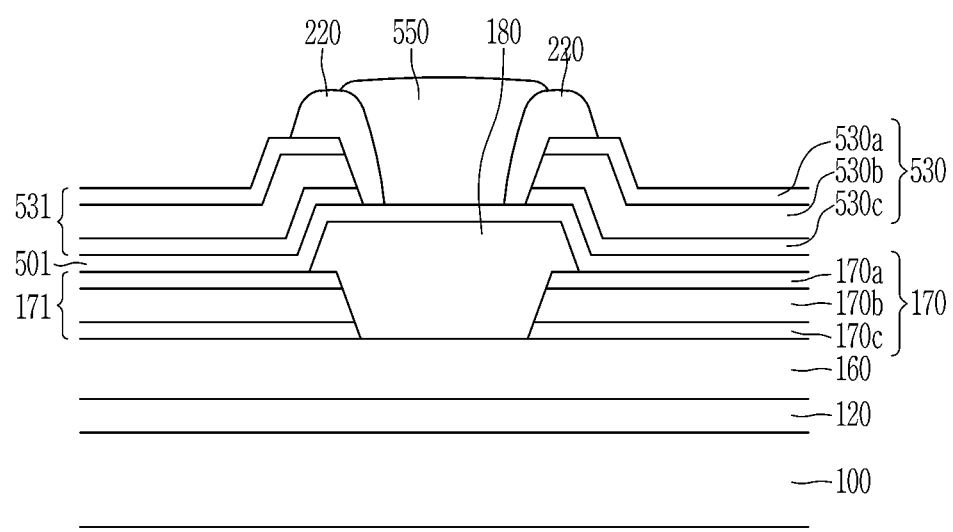
FIG. 40 is a view schematically illustrating portion L in FIG. 39 in detail.

FIG. 39 is a schematic cross-sectional view of a pad part of a light emitting display device according to another embodiment of FIG. 34 taken along line V-V' of FIG. 4. FIG. 40 is a view schematically illustrating portion L in FIG. 39 in detail.

Referring to FIG. 39 and FIG. 40, compared with the embodiment of FIG. 37 and FIG. 38, the upper planarization layer 550 may cover the part between the light blocking part 220 covering the edge and side surfaces of the first upper pad electrode 530 and the light blocking part 220 covering the edge and side surfaces of the adjacent second upper pad electrode 531. The upper planarization layer 550 may cover part of the light blocking part 220 and the exposed upper surface of the lower planarization layer 180. The upper planarization layer 550 of the non-display area NA and the upper planarization layer 550 of the display area DA may be formed of a same material and with a same method in a same layer.

While this invention has been described in connection with what is considered to be practical embodiments, it is to be understood that the invention is not limited to the disclosed embodiments. On the contrary, the invention includes various modifications and equivalent arrangements included within the spirit and scope of the appended claims and equivalents thereof.

What is claimed is:

1. A light emitting display device comprising: a substrate including a display area and a non-display area adjacent to the display area; a lower pad electrode disposed on the substrate in the non-display area; a lower planarization layer disposed on the lower pad electrode and including a via hole exposing an upper surface of the lower pad electrode; an upper pad electrode disposed on the lower pad electrode, the upper pad electrode being electrically connected to the lower pad electrode through the via hole; and a covering layer that is in contact with a side surface portion of the upper pad electrode and disposed between the upper pad electrode and an adjacent upper pad electrode, the side surface portion of the upper pad electrode being disposed on the lower planarization layer, wherein the covering layer includes at least one of a first color filter, a second color filter, and a third color filter, and wherein the upper pad electrode includes: an upper layer; a middle layer; and a lower layer,
   wherein the covering layer is in contact with the side surface portion of the upper pad electrode at the middle layer.

2. The light emitting display device of claim 1, wherein the display area includes:
   a transistor including a source electrode and a drain electrode, the lower planarization layer being disposed on the transistor;
   a light emitting diode disposed on the lower planarization layer;
   an encapsulation layer disposed on the light emitting diode;
   sensing electrodes disposed on the encapsulation layer;
   the first color filter disposed on the sensing electrodes;
   a light blocking part disposed on the first color filter;
   the second color filter disposed on the light blocking part;
   the third color filter disposed on the second color filter; and
   an upper planarization layer disposed on the third color filter.

3. The light emitting display device of claim 2, wherein the lower pad electrode and the source electrode and the drain electrode are disposed on a same layer.

4. The light emitting display device of claim 2, wherein the upper pad electrode and the sensing electrodes are disposed on a same layer.

5. The light emitting display device of claim 2, wherein
   the covering layer overlaps a portion of an upper surface of the lower planarization layer, wherein the portion of the upper surface of the lower planarization layer does not overlap the upper pad electrode, and
   the covering layer is in contact with a side surface of the upper pad electrode.

6. The light emitting display device of claim 5, wherein the covering layer includes the first color filter.

7. The light emitting display device of claim 6, wherein the first color filter includes one of a green color filter, a red color filter, and a blue color filter.

8. The light emitting display device of claim 2, wherein the covering layer overlaps a part of the upper surface of the lower planarization layer and overlaps an edge and side surfaces of the upper pad electrode.

9. The light emitting display device of claim 8, wherein the covering layer includes the first color filter.

10. The light emitting display device of claim 9, wherein the first color filter includes one of a green color filter, a red color filter, and a blue color filter.

11. The light emitting display device of claim 10, wherein the upper planarization layer overlaps another portion of the upper surface of the lower planarization layer, wherein the another portion of the upper surface of the lower planarization layer is not overlapped by the covering layer in the non-display area.

12. The light emitting display device of claim 1, wherein the display area includes:
    a transistor including a source electrode and a drain electrode, the lower planarization layer being disposed on the transistor;
    a light emitting diode disposed on the lower planarization layer;
    an encapsulation layer disposed on the light emitting diode;
    sensing electrodes disposed on the encapsulation layer;
    a light blocking part disposed on sensing electrodes;
    the first color filter disposed on the light blocking part;
    the second color filter disposed on the first color filter;
    the third color filter disposed on the second color filter; and
    an upper planarization layer disposed on the third color filter.

13. The light emitting display device of claim 12, wherein the light blocking part includes an organic material including a black color pigment without a conductive material.

14. The light emitting display device of claim 13, wherein
    the covering layer overlaps a portion of an upper surface of the lower planarization layer, wherein the portion of the upper surface of the lower planarization layer does not overlap the upper pad electrode.

15. The light emitting display device of claim 12, wherein the covering layer overlaps a part of the upper surface of the lower planarization layer and overlaps an edge and side surfaces of the upper pad electrode.

16. The light emitting display device of claim 12, wherein the upper planarization layer overlaps a portion of the upper surface of the lower planarization layer in the non-display area, wherein the portion of the upper surface of the lower planarization layer is not overlapped by the covering layer in the non-display area.

17. The light emitting display device of claim 1, wherein at least one of the upper pad electrode and the lower pad electrode includes:
    an upper layer including titanium (Ti);
    a middle layer including aluminum (Al); and
    a lower layer including titanium (Ti).

18. The light emitting display device of claim 1, further comprising:
    a buffer layer disposed between the lower planarization layer and the upper pad electrode.

19. A manufacturing method of a light emitting display device, the manufacturing method comprising: in a display area of a substrate, forming a transistor including a source electrode and a drain electrode; forming a lower planarization layer on the transistor; forming a light emitting diode on the lower planarization layer; forming an encapsulation layer on the light emitting diode; forming sensing electrodes on the encapsulation layer; forming a first color filter on the sensing electrodes; forming a light blocking part on the first color filter; forming a second color filter on the light blocking part; forming a third color filter on the second color filter; and forming an upper planarization layer on the third color filter; in a non-display area of the substrate, forming a lower pad electrode disposed on a same layer as the source electrode and the drain electrode; forming an upper pad electrode disposed on a same layer as the sensing electrodes, the upper pad electrode being disposed on the lower pad electrode; and forming a covering layer that is in contact with a side surface part of the upper pad electrode and disposed between the upper pad electrode and an adjacent upper pad electrode, the side surface part of the upper pad electrode being disposed on the lower planarization layer, wherein the covering layer includes the first color filter, and wherein the upper pad electrode includes: an upper layer; a middle layer; and a lower layer, wherein the covering layer is in contact with the side surface portion of the upper pad electrode at the middle layer.

20. A manufacturing method of a light emitting display device, the manufacturing method comprising: in a display area of a substrate, forming a transistor including a source electrode and a drain electrode; forming a lower planarization layer on the transistor; forming a light emitting diode on the lower planarization layer; forming an encapsulation layer on the light emitting diode; forming sensing electrodes on the encapsulation layer; forming a light blocking part on the sensing electrodes; forming a first color filter on the light blocking part; forming a second color filter on the first color filter; forming a third color filter on the second color filter; and forming an upper planarization layer on the third color filter; in a non-display area of the substrate, forming a lower pad electrode disposed on a same layer as the source electrode and the drain electrode; forming an upper pad electrode disposed on a same layer as the sensing electrodes, the upper pad electrode being disposed on the lower pad electrode; and forming a covering layer that is in contact with a side surface part of the upper pad electrode and disposed between the upper pad electrode and an adjacent upper pad electrode, the side surface part of the upper pad electrode being disposed on the lower planarization layer, wherein the covering layer includes the light blocking part, and wherein the upper pad electrode includes: an upper layer; a middle layer; and a lower layer, wherein the covering layer is in contact with the side surface portion of the upper pad electrode at the middle layer.

* * * * *